US 9,392,260 B2

(12) United States Patent
Imamura et al.

(10) Patent No.: US 9,392,260 B2
(45) Date of Patent: Jul. 12, 2016

(54) ARRAY OPTICAL ELEMENT, IMAGING MEMBER, IMAGING ELEMENT, IMAGING DEVICE, AND DISTANCE MEASUREMENT DEVICE

(71) Applicant: Panasonic Corporation, Osaka (JP)

(72) Inventors: Norihiro Imamura, Osaka (JP); Michihiro Yamagata, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 270 days.

(21) Appl. No.: 14/006,731

(22) PCT Filed: Jan. 25, 2013

(86) PCT No.: PCT/JP2013/000373
§ 371 (c)(1),
(2) Date: Sep. 23, 2013

(87) PCT Pub. No.: WO2013/111598
PCT Pub. Date: Aug. 1, 2013

(65) Prior Publication Data
US 2014/0055575 A1  Feb. 27, 2014

(30) Foreign Application Priority Data

Jan. 27, 2012  (JP) .................................. 2012-015400

(51) Int. Cl.
*H04N 9/00* (2006.01)
*H04N 13/02* (2006.01)
(Continued)

(52) U.S. Cl.
CPC ...... *H04N 13/0207* (2013.01); *H01L 27/14625* (2013.01); *H01L 27/14627* (2013.01);
(Continued)

(58) Field of Classification Search
CPC ............ H04N 13/021; H04N 13/0239; H04N 13/0438; H04N 13/0217; H04N 13/0296
See application file for complete search history.

(56) References Cited

U.S. PATENT DOCUMENTS

| | | | |
|---|---|---|---|
| 5,949,526 A * | 9/1999 | Koguchi | ............ H04N 1/40031 |
| | | | 355/41 |
| 2005/0068590 A1* | 3/2005 | Shiota | ........................ B41J 2/45 |
| | | | 358/474 |

(Continued)

FOREIGN PATENT DOCUMENTS

| | | |
|---|---|---|
| JP | 2006-314650 A | 11/2006 |
| JP | 2009-300268 A | 12/2009 |

(Continued)

OTHER PUBLICATIONS

International Search Report for corresponding International Application No. PCT/JP2013/000373 mailed May 7, 2013.

(Continued)

*Primary Examiner* — Jay Patel
*Assistant Examiner* — Frank Huang
(74) *Attorney, Agent, or Firm* — Renner, Otto, Boisselle & Skalr, LLP

(57) ABSTRACT

A lens optical system L having areas D1 and D2; an image pickup element N including a plurality of first and second pixels which include a filter having a first spectral transmittance characteristic, a plurality of third pixels which include a filter having a second spectral transmittance characteristic, and a plurality of fourth pixels which include a filter having a third spectral transmittance characteristic; and an array-form optical element K including a plurality of optical components M1 and M2 are included. The plurality of optical components M1 and M2 are arrayed in n number of rows from first through n'th rows (n is an integer of 2 or greater) on a surface of the array-form optical element K. A position of center, in a y direction, of each of the optical components located in a k'th row ($1 \leq k < n$) among the n number of rows is shifted in the y direction with respect to a position of center, in the y direction, of a corresponding one of the optical components located in a (k+1)th row among the n number of rows.

14 Claims, 20 Drawing Sheets

(51) Int. Cl.
    *H04N 9/07*           (2006.01)
    *H04N 5/225*         (2006.01)
    *H01L 27/146*       (2006.01)
    *H04N 9/04*           (2006.01)

(52) U.S. Cl.
    CPC .............. *H04N5/2254* (2013.01); *H04N 9/07* (2013.01); *H04N 13/0217* (2013.01); *H04N 13/0228* (2013.01); *H04N 13/0232* (2013.01); *H04N 13/0257* (2013.01); *H04N 9/045* (2013.01)

(56) References Cited

U.S. PATENT DOCUMENTS

| | | | |
|---|---|---|---|
| 2006/0082726 A1 | 4/2006 | Suzuki | |
| 2010/0073463 A1 | 3/2010 | Momonoi et al. | |
| 2010/0188584 A1* | 7/2010 | Liu | G06T 7/0051 348/699 |
| 2011/0149125 A1* | 6/2011 | Morimoto | H04N 5/225 348/272 |
| 2012/0050562 A1* | 3/2012 | Perwass | H04N 13/0232 348/222.1 |
| 2013/0100251 A1 | 4/2013 | Endo | |
| 2013/0107017 A1 | 5/2013 | Endo | |

FOREIGN PATENT DOCUMENTS

| | | |
|---|---|---|
| JP | 2010-078768 A | 4/2010 |
| JP | 2011-515045 T | 5/2011 |
| JP | 2011-135170 A | 7/2011 |
| JP | 2011-248032 A | 12/2011 |
| WO | WO 2009/110958 A2 | 9/2009 |
| WO | WO 2010/121637 A1 | 10/2010 |
| WO | WO 2011/003168 A1 | 1/2011 |

OTHER PUBLICATIONS

Form PCT/ISA/237 for corresponding International Application No. PCT/JP2013/000373 dated May 7, 2013 and partial English translation.

* cited by examiner

FIG.5
(a)
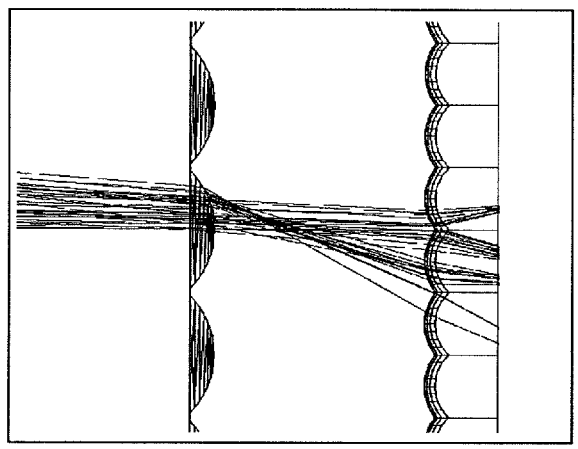
(b)
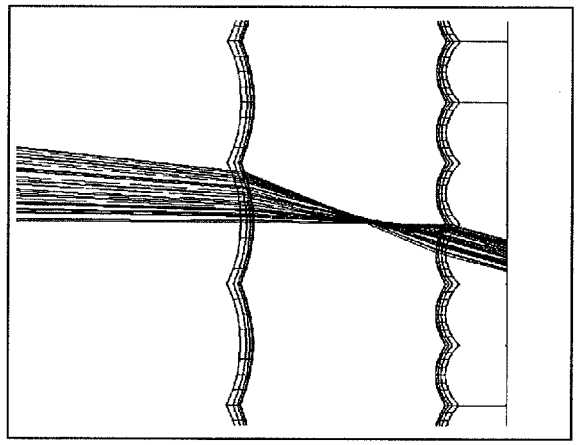
(c)
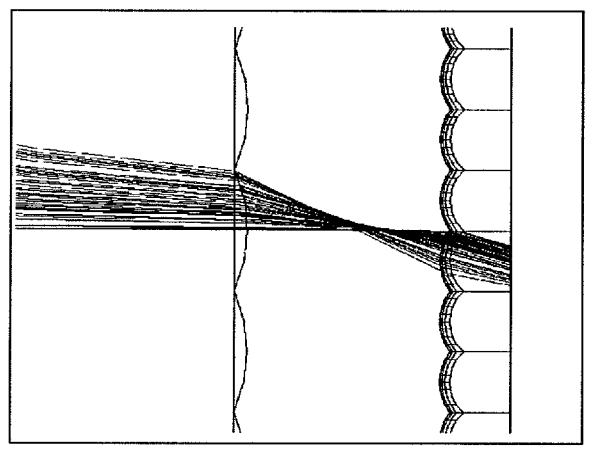

FIG.6
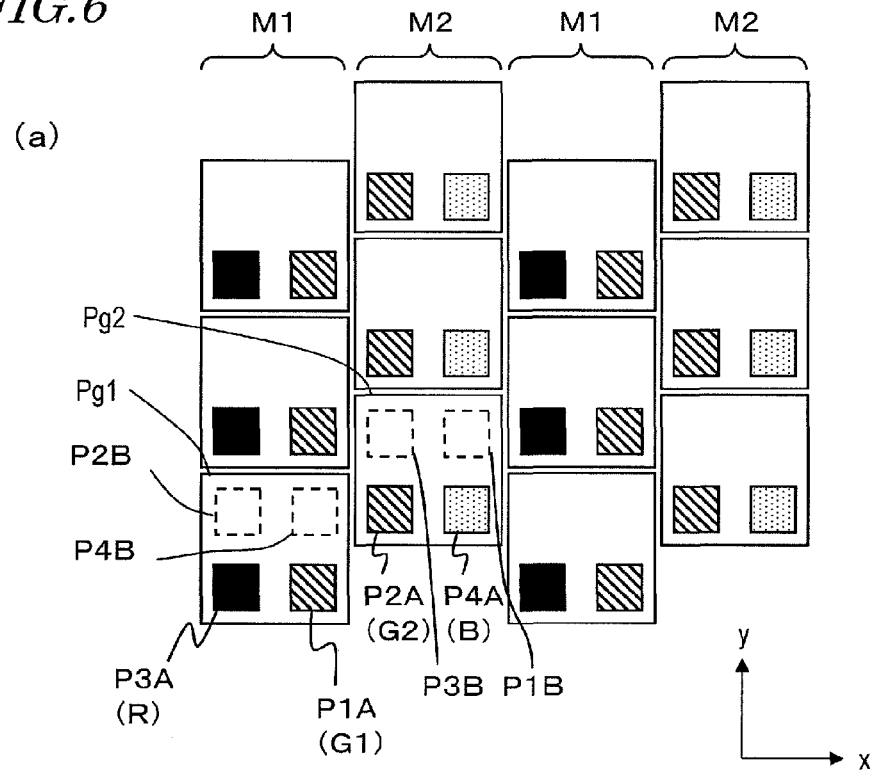
(a)
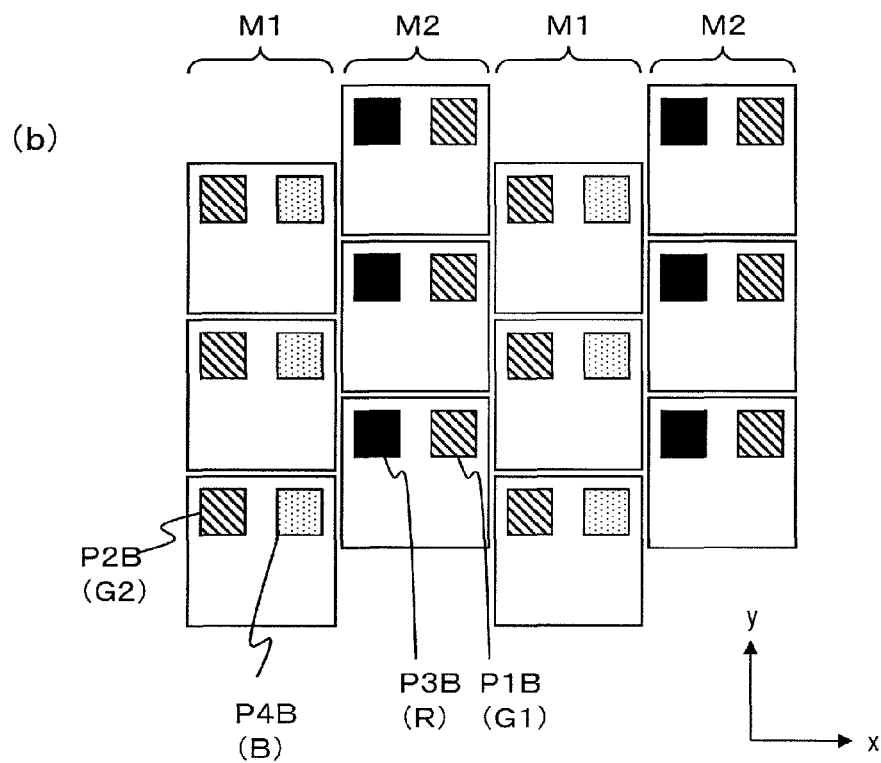
(b)

FIG. 8
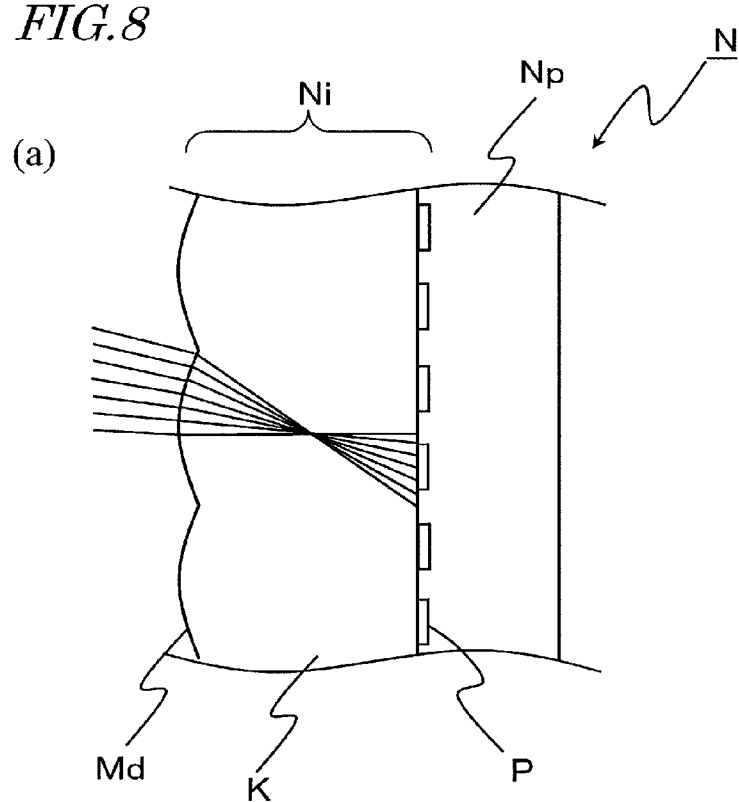
(a)
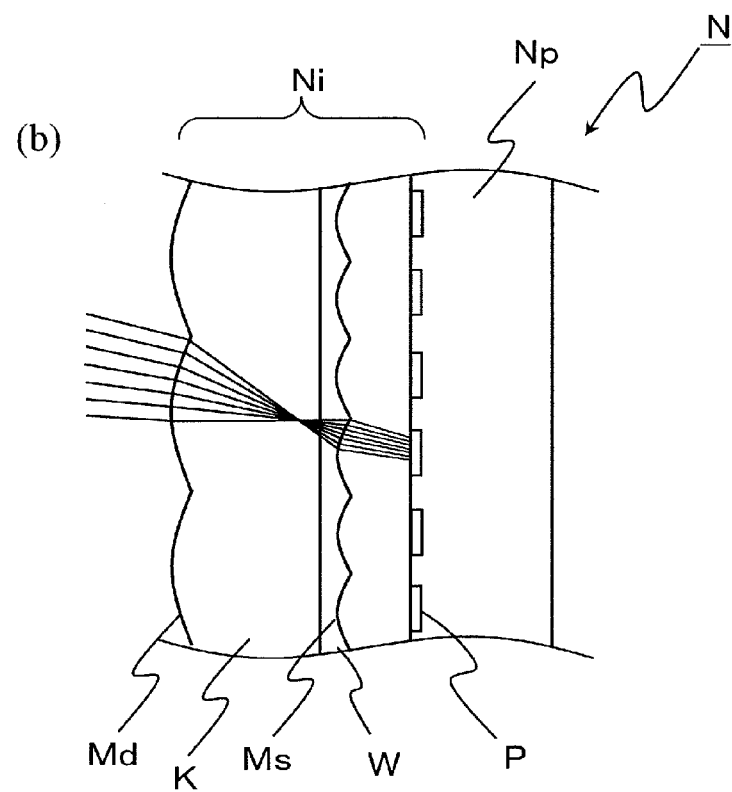
(b)

(a)  (b)

FIG.13
(a)
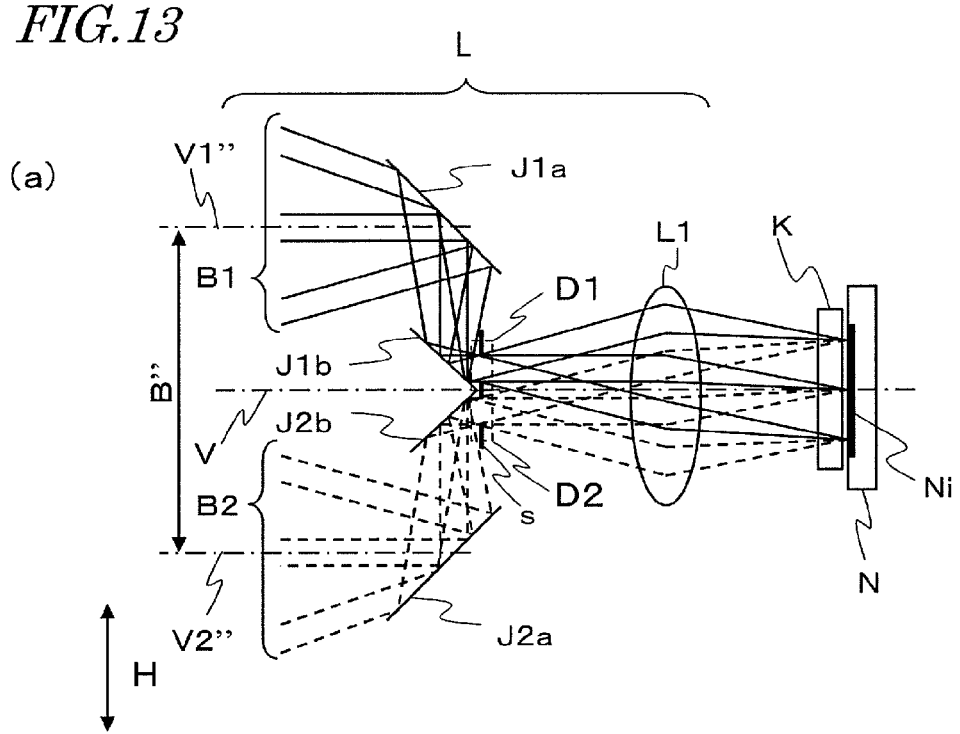
(b)
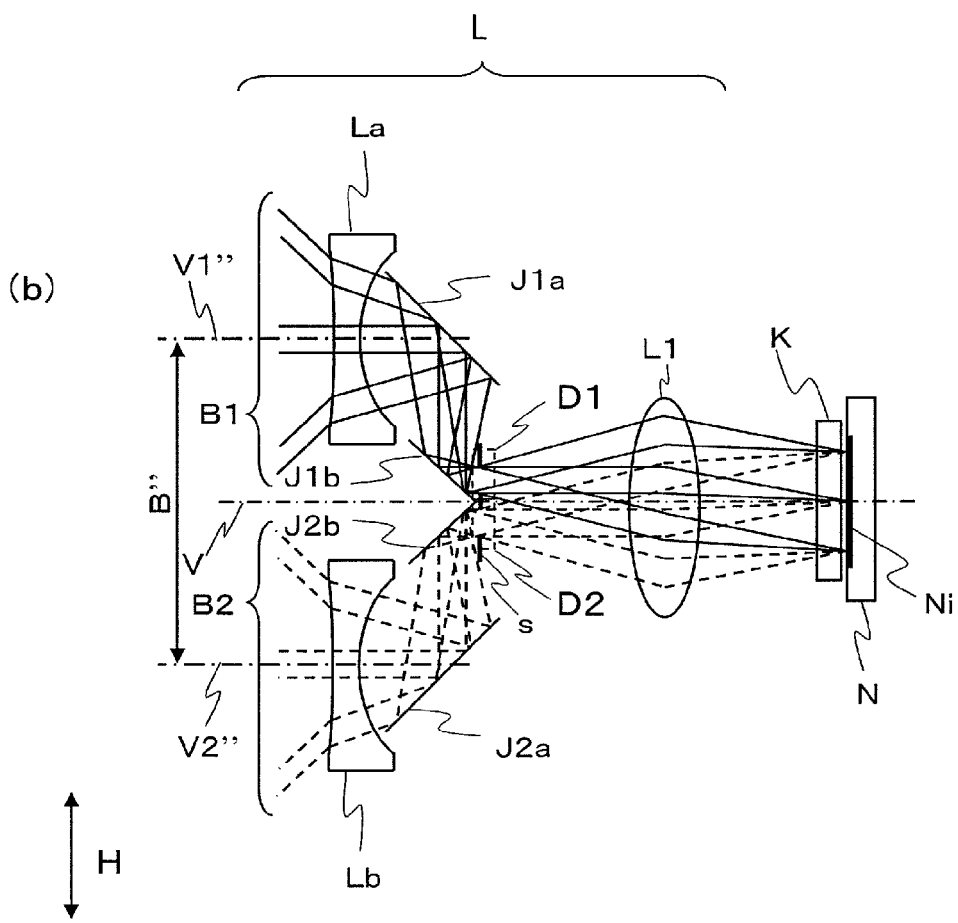

FIG.17
(a)
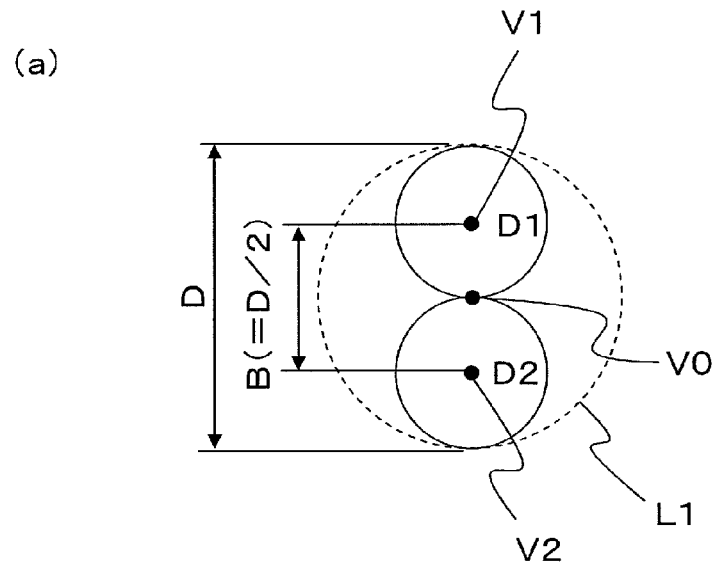
(b)
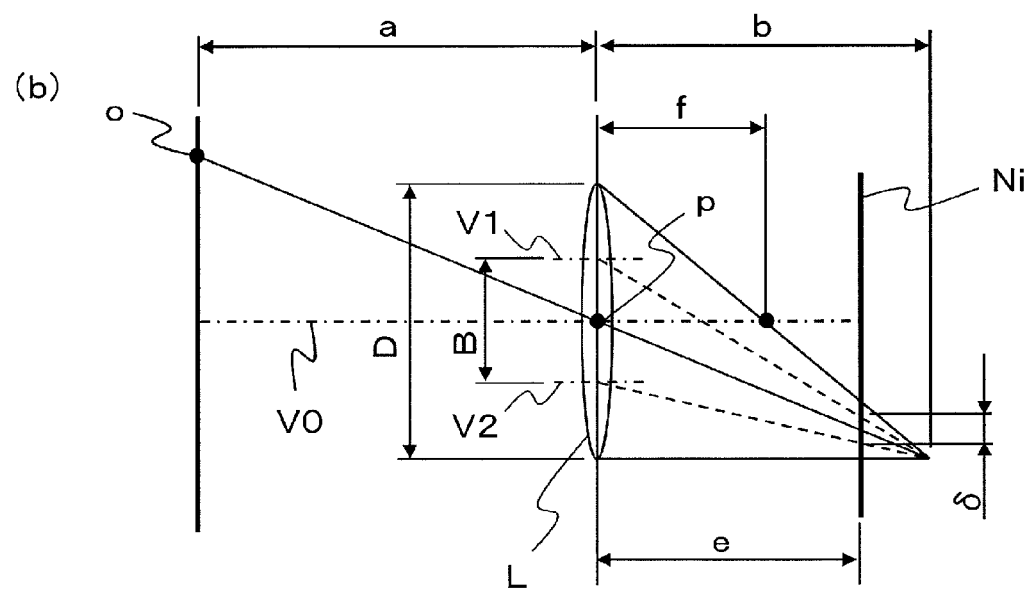

FIG.19
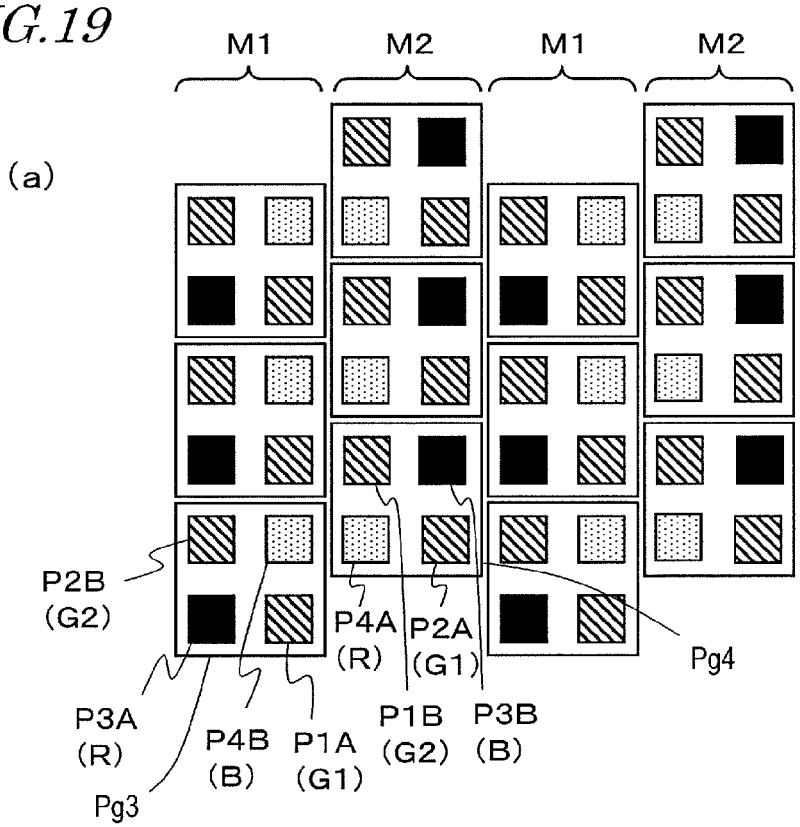
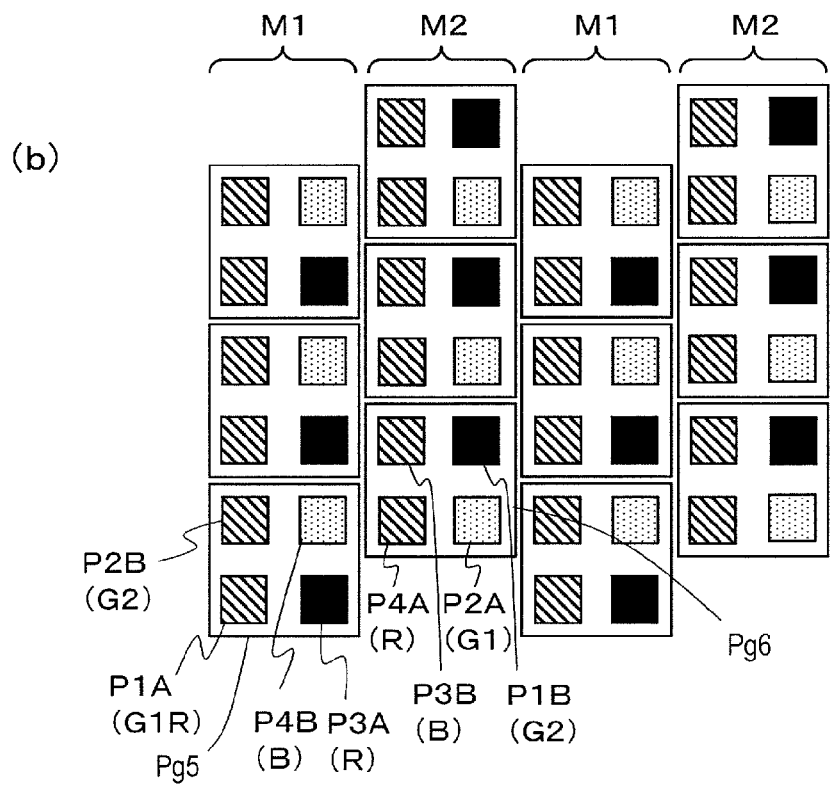

ARRAY OPTICAL ELEMENT, IMAGING MEMBER, IMAGING ELEMENT, IMAGING DEVICE, AND DISTANCE MEASUREMENT DEVICE

TECHNICAL FIELD

The present application relates to an image pickup device such as a camera or the like, and a distance measuring device thereof. The present application also relates to an array-form optical element and an image pickup member usable for the image pickup device and the distance measuring device.

BACKGROUND ART

Recently, an image pickup device usable for stereoscopically viewing a subject by use of a plurality of image pickup optical systems has been practically used for a digital still camera, a digital movie camera, a camera of an endoscope for medical use and the like. Also, a distance measuring device for measuring a distance to a subject (distance measuring subject) by use of parallax between a plurality of image pickup optical systems is used for an inter-vehicle distance measuring system of an automobile, an autofocus system of a camera, and a three-dimensional shape measuring system.

In the above-described image pickup device, a left eye image and a right eye image for stereoscopic viewing are acquired by a pair of image pickup optical system located on the left side and the right side. In the above-described distance measuring device, the distance to the subject is detected by triangulation based on parallax between the left eye image and the right eye image.

The image pickup device and the distance measuring device as described above use two image pickup devices and thus involve problems of a large size and high cost of the device.

In order to solve these problems, an image pickup device for acquiring an image for stereoscopic viewing from a single image pickup optical system has been proposed (Patent Documents 1 and 2).

CITATION LIST

Patent Literature

Patent Document 1: Japanese Laid-Open Patent Publication No. 2006-314650
Patent Document 2: Japanese Laid-Open Patent Publication No. 2011-515045

SUMMARY OF INVENTION

Technical Problem

However, with the above-described conventional art, a further improvement in resolution is desired. A non-limiting, illustrative embodiment of the present application provides an image pickup device for acquiring a color image for stereoscopic viewing which has a high resolution by use of a single image pickup optical system, and also provides an array-form optical element, an image pickup element and an image pickup member usable for such an image pickup device.

Solution to Problem

An image pickup device in an embodiment according to the present invention includes a lens optical system including a first area and a second area located at a position different from that of the first area; an image pickup element including a plurality of pixels and an image pickup face, the plurality of pixels including a plurality of first pixels and a plurality of second pixels on which light that has passed the lens optical system is incident and which include a filter having a first spectral transmittance characteristic, a plurality of third pixels on which light that has passed the lens optical system is incident and which include a filter having a second spectral transmittance characteristic, and a plurality of fourth pixels on which light that has passed the lens optical system is incident and which include a filter having a third spectral transmittance characteristic; and an array-form optical element located between the lens optical system and the image pickup element, the array-form optical element including a plurality of optical components. The plurality of pixels have one row of first through l'th pixels (l is an integer of 2 or greater) arrayed in a first direction, and m number of such rows (m is an integer of 2 or greater) are arrayed in a second direction as first through m'th rows; and thus the plurality of pixels are arrayed on the image pickup face; a position of center, in the first direction, of each of the l number of pixels located in a j'th row among the m number of rows ($1 \leq j < m$) is substantially the same as a position of center, in the first direction, of a corresponding one of the l number of pixels located in a (j+1)th row; and the plurality of optical components are arrayed on a surface of the array-form optical element such that first through s'th optical components (s is an integer of 2 or greater) are arrayed in one column in the second direction, and t number of such columns (t is an integer of 2 or greater) are arrayed in the first direction as first through t'th columns; and a position of center, in the second direction, of each of the optical components located in a k'th column among the t number of columns ($1 \leq k < t$) is shifted in the second direction with respect to a position of center, in the second direction, of a corresponding one of the optical components located in a (k+1)th column.

An image pickup system in an embodiment according to the present invention includes an image pickup device according to the present invention; and a signal processing device for generating a first color image by use of luminance information on the 1A, 2A, 3A and 4A pixels and generating a second color image by use of luminance information on the 1B, 2B, 3B and 4B pixels.

An array-form optical element in an embodiment according to the present invention includes a plurality of optical components on a surface thereof, wherein the plurality of optical components are arrayed on the surface such that t number of columns, each including s number of optical components arrayed in the second direction, are arrayed in the first direction (s and t are each an integer of or greater); and a position of center, in the second direction, of each of the optical components located in a k'th column among the t number of columns ($1 \leq k < t$) is shifted in the second direction with respect to a position of center, in the second direction, of a corresponding one of the optical components located in a (k+1)th row.

An image pickup member in an embodiment according to the present invention includes an image pickup element having an image pickup face and an array-form optical element including a plurality of optical components on a surface thereof facing the image pickup face. The image pickup element includes a plurality of pixels arrayed on the image pickup face in m rows by l columns (l and m are each an integer of 2 or greater); and in the case where one of the plurality of optical components is located at a position corresponding to four pixels located at positions (p, q), (p, q+1), (p+1, q) and (p+1, q+1) on the image pickup face (1≤p<l, 1≤q<m), another one of the plurality of optical components is located at a position corresponding to four pixels located at positions (p+2, q+1), (p+2, q+2), (p+3, q+1) and (p+3, q+2) on the image pickup face.

An image pickup device in an embodiment according to the present invention includes an image pickup section having an image pickup face and an array-form optical element provided on the image pickup face and including a plurality of optical components. The image pickup section includes a plurality of pixels arrayed on the image pickup face in m rows by l columns (l and m are each an integer of 2 or greater); and in the case where one of the plurality of optical components is located at a position corresponding to four pixels located at positions (p, q), (p, q+1), (p+1, q) and (p+1, q+1) on the image pickup face (1≤p<L, 1≤q<m), another one of the plurality of optical components is located at a position corresponding to four pixels located at positions (p+2, q+1), (p+2, q+2), (p+3, q+1) and (p+3, q+2) on the image pickup face.

An image pickup device in another embodiment according to the present invention includes a lens optical system including a first area and a second area located at a position different from that of the first area; an image pickup element including a first pixel group which includes four pixels of a 1A pixel, a 2B pixel, a 3A pixel and a 4B pixel arrayed in two rows by two columns on an image pickup face, and also including a second pixel group which includes four pixels of a 2A pixel, a 1B pixel, a 3B pixel and a 4A pixel arrayed in two rows by two columns on the image pickup face; and an array-form optical element located between the lens optical system and the image pickup element, the array-form optical element including a plurality of first optical components and a plurality of second optical components. The 1A, 2A, 1B and 2B pixels include a filter having a first spectral transmittance characteristic, the 3A and 3B pixels include a filter having a second spectral transmittance characteristic, and the 4A and 4B pixels include a filter having a third spectral transmittance characteristic; the plurality of first optical components each cause light which has passed the first area to be incident on the 1A pixel and the 3A pixel, and cause light which has passed the second area to be incident on the 2B pixel and the 4B pixel; and the plurality of second optical components each cause the light which has passed the first area to be incident on the 2A pixel and the 4A pixel, and cause the light which has passed the second area to be incident on the 1B pixel and the 3B pixel.

The above-described general and specific embodiments may be implemented by use of a system, a method and a computer program, or may be realized by a combination of a system, a method and a computer program.

Advantageous Effects of Invention

An image pickup device in an embodiment of the present invention can acquire a color image for stereoscopic viewing which has a high resolution by use of a single image pickup optical system. Also according to an embodiment of the present invention, an array-form optical element and an image pickup member usable for such an image pickup device can be provided.

BRIEF DESCRIPTION OF DRAWINGS

FIG. 4(a2) is an isometric view of the microlens array shown in FIG. 4(a1); FIG. 4(b1) shows an arrangement of a microlens array having a rotationally symmetric shape with respect to the optical axis, and contours thereof; FIG. 4(b2) is an isometric view of the microlens array shown in FIG. 4(b1); FIG. 4(c1) shows an arrangement of cylindrical microlenses shifted alternately by half pitch, and contours thereof; and FIG. 4(c2) is an isometric view of a cylindrical microlens array shown in FIG. 4(c1).

FIG. 5(a) shows results of light ray tracing simulation when the microlenses shown in FIGS. 4(a1) and (a2) are applied to the array-form optical element in Embodiment 1; FIG. 5(b) shows results of light ray tracing simulation when the microlenses shown in FIGS. 4(b1) and (b2) are applied to the array-form optical element in Embodiment 1; and FIG. 5(c) shows results of light ray tracing simulation when the microlenses shown in FIGS. 4(c1) and (c2) are applied to the array-form optical element in Embodiment 1.

FIGS. 6(a) and (b) each show pixels reached by light which has passed the first and second areas.

FIGS. 8(a) and (b) are each an enlarged view of an array-form optical element K and an image pickup element N in Embodiment 2.

FIGS. 12(a2) through (e2) are each a graph showing relative transmittances of the areas D1 and D2.

FIGS. 13(a) and (b) are each a schematic view of an optical system in Embodiment 6.

FIGS. 17(a) and (b) are conceptual views provided for explaining a distance measuring principle in Embodiment 8.

FIGS. 19(a) and (b) show filter arrangements on an image pickup element in other embodiments.

DESCRIPTION OF EMBODIMENTS

Figure 20:
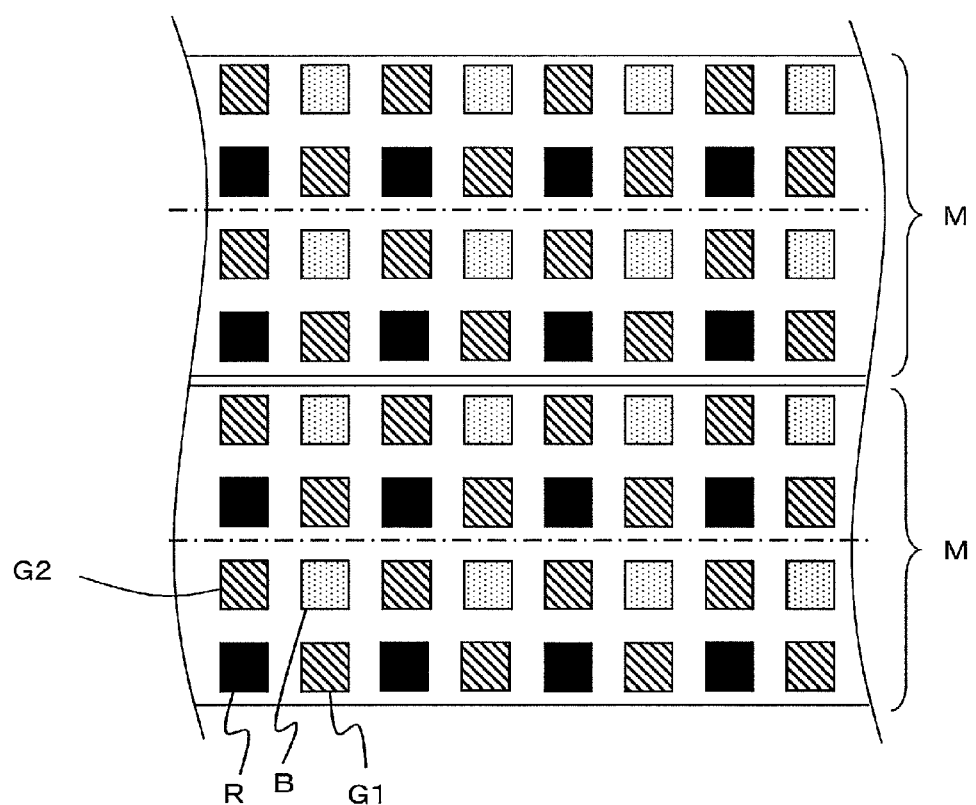
FIG. 20 shows a positional relationship between an array-form optical element K and an image pickup device N in a conventional structure.

The inventors of the present application thoroughly studied the image pickup devices disclosed in Patent Documents 1 and 2 and found the following. The image pickup devices by such conventional technologies use color image pickup elements located in an existing Bayer array. Thus, as shown in FIG. 20, one optical component M in a lenticular lens is located so as to cover four pixel rows. This significantly decreases the resolution. In light of this problem, the present inventors conceived an image pickup device, an image pickup element and an optical element having a novel structure. The overview of an embodiment of the present invention is as follows.

An image pickup device in an embodiment according to the present invention includes a lens optical system including a first area and a second area located at a position different from that of the first area; an image pickup element including a plurality of pixels and an image pickup face, the plurality of pixels including a plurality of first pixels and a plurality of second pixels on which light that has passed the lens optical system is incident and which include a filter having a first spectral transmittance characteristic, a plurality of third pixels on which light that has passed the lens optical system is incident and which include a filter having a second spectral transmittance characteristic, and a plurality of fourth pixels on which light that has passed the lens optical system is incident and which include a filter having a third spectral transmittance characteristic; and an array-form optical element located between the lens optical system and the image pickup element, the array-form optical element including a plurality of optical components. The plurality of pixels have one row of first through l'th pixels (l is an integer of 2 or greater) arrayed in a first direction, and m number of such rows (m is an integer of 2 or greater) are arrayed in a second direction as first through m'th rows; and thus the plurality of pixels are arrayed on the image pickup face; a position of center, in the first direction, of each of the l number of pixels located in a j'th row among the m number of rows ($1 \leq j < m$) is substantially the same as a position of center, in the first direction, of a corresponding one of the l number of pixels located in a (j+1)th row; and the plurality of optical components are arrayed on a surface of the array-form optical element such that first through s'th optical components (s is an integer of 2 or greater) are arrayed in one column in the second direction, and t number of such columns (t is an integer of 2 or greater) are arrayed in the first direction as first through t'th columns; and a position of center, in the second direction, of each of the optical components located in a k'th column among the t number of columns ($1 \leq k < t$) is shifted in the second direction with respect to a position of center, in the second direction, of a corresponding one of the optical components located in a (k+1)th column.

Where a distance between centers, in the second direction, of two optical components adjacent to each other in the second direction, among the plurality of optical components, is Y on the surface of the array-form optical element, the position of the center, in the second direction, of each of the optical components located in the k'th column may be shifted by 0.45Y or greater and 0.55Y or less in the second direction with respect to the position of the center, in the second direction, of a corresponding one of the optical components located in the (k+1)th column.

The plurality of first, second, third and fourth pixels may be arrayed on the image pickup face in m rows by l columns (l and m are each an integer of 2 or greater); and in the case where one of the plurality of optical components is located at a position corresponding to four pixels located at positions (p, q), (p, q+1), (p+1, q) and (p+1, q+1) on the image pickup face ($1 \leq p < l$, $1 \leq q < m$), another one of the plurality of optical components may be located at a position corresponding to four pixels located at positions (p+2, q+1), (p+2, q+2), (p+3, q+1) and (p+3, q+2) on the image pickup face.

The plurality of first pixels may include a 1A pixel and a 1B pixel, the plurality of second pixels include a 2A pixel and a 2B pixel, the plurality of third pixels include a 3A pixel and a 3B pixel, and the plurality of fourth pixels include a 4A pixel and a 4B pixel; the optical components in the k'th row may cause light which has passed the first area to be incident on the 1A pixel and the 3A pixel, and cause light which has passed the second area to be incident on the 2B pixel and the 4B pixel; and the optical components in the (k+1)th row may cause the light which has passed the first area to be incident on the 2A pixel and the 4A pixel, and cause the light which has passed the second area to be incident on the 1B pixel and the 3B pixel.

The image pickup device may further include a first signal processing section for generating a first color image by use of luminance information on the 1A, 2A, 3A and 4A pixels and generating a second color image by use of luminance information on the 1B, 2B, 3B and 4B pixels.

The plurality of optical components may be each formed of one or two microlenses.

The first, second, third and fourth pixels may be located in a Bayer array.

The first area and the second area may be separated from each other along a border having an optical axis of the lens optical system at a center thereof.

The plurality of optical components may each have a shape rotationally symmetric with respect to an optical axis.

The plurality of optical components may each have a cylindrical shape.

The lens optical system may be an image-side telecentric optical system.

The lens optical system may be an image-side non-telecentric optical system; and the array of the array-form optical element may be offset with respect to the array of the pixels of the image pickup device outside the optical axis of the lens optical system.

The array-form optical element may be formed on the image pickup element.

The image pickup device may further include a microlens provided between the array-form optical element and the image pickup element. The array-form optical element may be formed on the image pickup element with the microlens being held therebetween.

The lens optical system may further include a liquid crystal shutter array for changing the positions of the first area and the second area.

The lens optical system may further include a liquid crystal shutter array in which a transmittance through an opening thereof is changeable.

The lens optical system may further include a 1A reflecting member and a 1B reflecting member for causing light to be incident on the first area, and a 2A reflecting member and a 2B reflecting member for causing light to be incident on the second area.

The lens optical system may further include a relay optical system.

A distance measuring device in an embodiment according to the present invention includes the above-described image pickup device; and a second signal processing section for calculating a distance to a subject by use of the first color image and the second color image.

An image pickup system in an embodiment according to the present invention includes the above-described image pickup device; and a signal processing device for generating a first color image by use of luminance information on the 1A, 2A, 3A and 4A pixels and generating a second color image by use of luminance information on the 1B, 2B, 3B and 4B pixels.

An array-form optical element in an embodiment according to the present invention includes a plurality of optical components on a surface thereof, wherein the plurality of optical components are arrayed on the surface such that t number of columns, each including s number of optical components arrayed in the second direction, are arrayed in the first direction (s and t are each an integer of or greater); and a position of center, in the second direction, of each of the optical components located in a k'th column among the t number of columns (1≤k<t) is shifted in the second direction with respect to a position of center, in the second direction, of a corresponding one of the optical components located in a (k+1)th row.

The plurality of optical components may be each formed of one or two microlenses.

An image pickup member in an embodiment according to the present invention includes an image pickup element having an image pickup face and an array-form optical element including a plurality of optical components on a surface thereof facing the image pickup face. The image pickup element includes a plurality of pixels arrayed on the image pickup face in m rows by l columns (l and m are each an integer of 2 or greater); and in the case where one of the plurality of optical components is located at a position corresponding to four pixels located at positions (p, q), (p, q+1), (p+1, q) and (p+1, q+1) on the image pickup face (1≤p<l, 1≤q<m), another one of the plurality of optical components is located at a position corresponding to four pixels located at positions (p+2, q+1), (p+2, q+2), (p+3, q+1) and (p+3, q+2) on the image pickup face.

An image pickup device in an embodiment according to the present invention includes an image pickup section having an image pickup face and an array-form optical element provided on the image pickup face and including a plurality of optical components. The image pickup section includes a plurality of pixels arrayed on the image pickup face in m rows by l columns (l and m are each an integer of 2 or greater); and in the case where one of the plurality of optical components is located at a position corresponding to four pixels located at positions (p, q), (p, q+1), (p+1, q) and (p+1, q+1) on the image pickup face (1≤p<L, 1≤q<m), another one of the plurality of optical components is located at a position corresponding to four pixels located at positions (p+2, q+1), (p+2, q+2), (p+3, q+1) and (p+3, q+2) on the image pickup face.

The image pickup element may further include a microlens provided between the array-form optical element and the image pickup element. The array-form optical element may be formed on the image pickup section with the microlens being held therebetween.

An image pickup device in another embodiment according to the present invention includes a lens optical system including a first area and a second area located at a position different from that of the first area; an image pickup element including a first pixel group which includes four pixels of a 1A pixel, a 2B pixel, a 3A pixel and a 4B pixel arrayed in two rows by two columns on an image pickup face, and also including a second pixel group which includes four pixels of a 2A pixel, a 1B pixel, a 3B pixel and a 4A pixel arrayed in two rows by two columns on the image pickup face; and an array-form optical element located between the lens optical system and the image pickup element, the array-form optical element including a plurality of first optical components and a plurality of second optical components. The 1A, 2A, 1B and 2B pixels include a filter having a first spectral transmittance characteristic, the 3A and 3B pixels include a filter having a second spectral transmittance characteristic, and the 4A and 4B pixels include a filter having a third spectral transmittance characteristic; the plurality of first optical components each cause light which has passed the first area to be incident on the 1A pixel and the 3A pixel, and cause light which has passed the second area to be incident on the 2B pixel and the 4B pixel; and the plurality of second optical components each cause the light which has passed the first area to be incident on the 2A pixel and the 4A pixel, and cause the light which has passed the second area to be incident on the 1B pixel and the 3B pixel.

Hereinafter, an image pickup device in each of embodiments of the present invention will be described with reference to the drawings.

Embodiment 1

Figure 1:
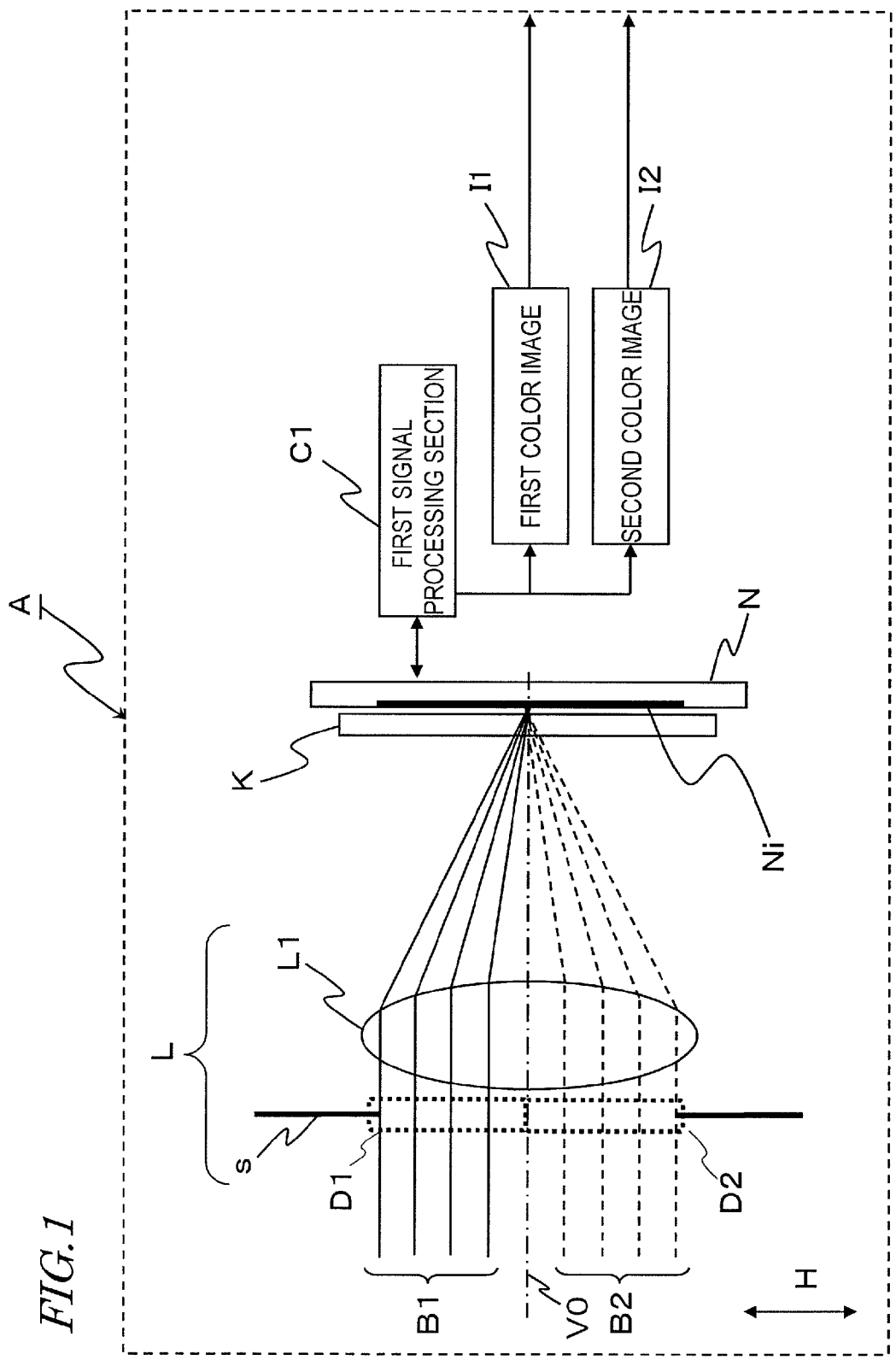
FIG. 1 is a schematic view of an image pickup device A in Embodiment 1 according to the present invention.

FIG. 1 is a schematic view of an image pickup device A in Embodiment 1. The image pickup device A in this embodiment includes a lens optical system L having an optical axis V0, an array-form optical element K located in the vicinity of a focal point of the lens optical system L, an image pickup element N, and a first signal processing section C1.

The lens optical system L includes a stop s and an objective lens L1 on which light that has passed the stop s is incident. The lens optical system L includes an area D1 and an area D2 located at a different position from that of the area D1. As shown in FIG. 1, the areas D1 and D2 are areas of the lens optical system L which are separated from each other along a plane passing the optical axis. The areas D1 and D2 include an opening of the stop s. The stop s causes light from a subject to be incident on the area D1 or the area D2.

Figure 2:
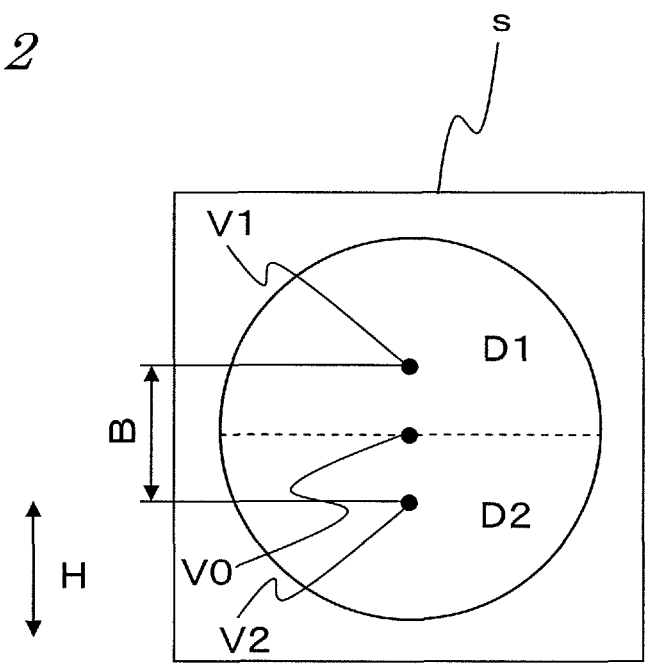
FIG. 2 is a front view of areas D1 and D2 in Embodiment 1 according to the present invention as seen from the side of a subject.

FIG. 2 is a front view of the stop s as seen from the side of the subject. In FIG. 1 and FIG. 2, arrow H represents a horizontal direction when the image pickup device is used. In the stop s, the areas D1 and D2 are separated from each other as a left part and a right part in the horizontal direction (upper part and lower part in FIG. 2), along a plane perpendicular to the optical axis V0, which is the center of the border between the areas D1 and D2. Point V1 and point V2 are respectively centers of gravity of the area D1 and the area D2 in the stop s. Distance B between the point V1 and the point V2 corresponds to a base length in the case where both eyes are used for viewing.

Figure 3:
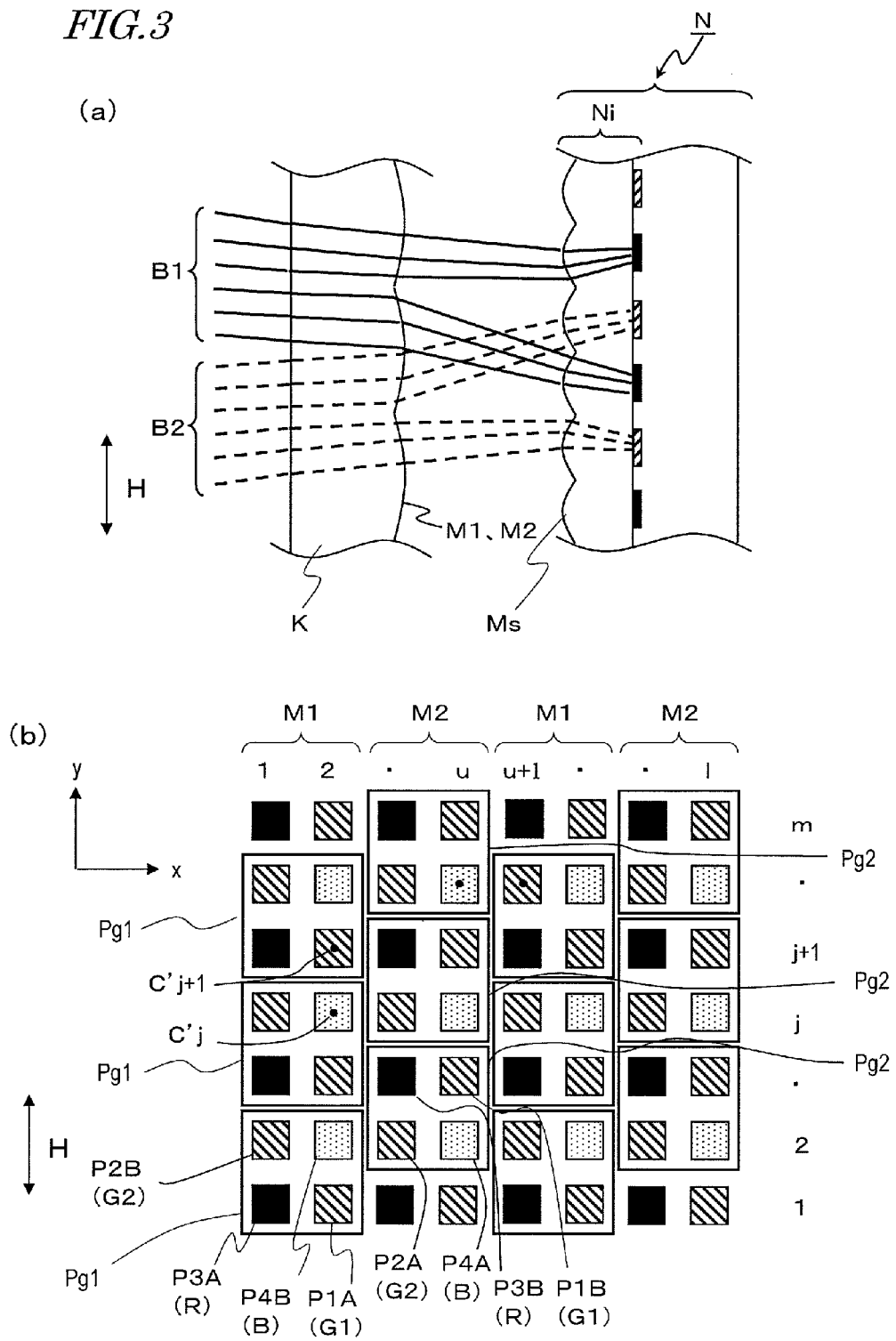
FIG. 3(a) is an enlarged view of an array-form optical element K and an image pickup element N shown in FIG. 1.
FIG. 3(b) shows a positional relationship between the array-form optical element K and pixels on the image pickup element N.

In FIG. 1, a luminous flux B1 passes the area D1 in the stop s, and a luminous flux B2 passes the area D2 in the stop s. The luminous fluxes B1 and B2 pass the stop s, the objective lens L1 and the array-form optical element K in this order, and then reach an image pickup face Ni (shown in FIG. 3) of the image pickup element N.

FIG. 3(a) is an enlarged view of the array-form optical element K and the image pickup element N shown in FIG. 1. The array-form optical element K includes a plurality of optical components M1 and a plurality of optical components M2, and is located such that a plane thereof having the plurality of optical components M1 and M2 formed thereon faces the image pickup face Ni.

As shown in FIG. 1, the array-form optical element K is located in the vicinity of the focal point of the lens optical system L, at a position away from the image pickup face Ni by a prescribed distance. The position of the array-form optical element K may be determined based on, for example, the focal point of the objective lens L1.

FIG. 3(b) shows a positional relationship between the plurality of optical components M1 and M2 of the array-form optical element K and pixels on the image pickup element N. The image pickup element N includes the plurality of pixels arrayed on the image pickup face Ni. As shown in FIG. 3(b), the plurality of pixels are arrayed in an x direction (first direction) and a y direction (second direction), namely, two dimensionally. Where an array of pixels located in the x direction is referred to as a "row" and an array of pixels located in the y direction is referred to as a "column", the plurality of pixels are arrayed in, for example, m number of rows by l columns (l and m are each an integer of 2 or greater) on the image pickup face Ni. Namely, first through l'th pixels are arrayed in one row in the x direction, and m number of such rows are arrayed in the y direction as first through m'th rows.

In a j'th row ($1 \leq j < m$) among the m number of rows, l number of pixels are located. In the (j+1)th row also, l number of pixels are located. The position of center C'j, in the x direction, of each of the l number of pixels located in the j'th row is substantially the same as the position of center C'j+1, in the x direction, of a corresponding one of the l number of pixels located in the (j+1)th row.

Such an array may also be considered that a plurality of pixel are arrayed in one column in the y direction, and l number of such columns are arrayed in the x direction as first through l'th columns. In this case, in a u'th column ($1 \leq u < l$) among the l number of columns, m number of pixels are located. In the (u+1)th column also, m number of pixels are located. The position of the center, in the y direction, of each of the m number of pixels located in the u'th column is substantially the same as the position of the center, in the y direction, of a corresponding one of the m number of pixels located in the (u+1)th column.

In this embodiment, the plurality of pixels have the same shape on the image pickup face Ni. For example, the plurality of pixels have the same rectangular shape and have an equal area size. In this embodiment, the plurality of pixels are arrayed at an equal pitch in the x direction and the y direction.

For the sake of explanation, the plurality of pixels are divided into a plurality of pixels P1A, P2A, P3A, P4A, P1B, P2B, P3B and P4B. One of the plurality of pixels P1A, one of the plurality of pixels P2B, one of the plurality of pixel P3A and one of the plurality of pixels P4B are arrayed in two rows by two columns on the image pickup face Ni. The pixels P1A, P2B, P3A and P4B arrayed in two rows by two columns will be referred to as a "first pixel group Pg1". One of the plurality of pixels P1B, one of the plurality of pixels P2A, one of the plurality of pixel P3B and one of the plurality of pixels P4A are arrayed in two rows by two columns on the image pickup face Ni. The pixels P1B, P2A, P3B and P4A arrayed in two rows by two columns will be referred to as a "second pixel group Pg2".

Now, it is assumed that the pixel P3A belonging to the first pixel group Pg1 is located at a position (p, q). p and q are respectively integers fulfilling $1 \leq p < l$ and $1 \leq q < m$. In this case, the remaining pixels P1A, P2B and P4B in the first pixel group Pg1 are respectively located at positions (p+1, q), (p, q+1) and (p+1, q+1). The pixels P2A, P1B, P3B and P4A in the second pixel group Pg2 are respectively located at positions (p+2, q+1), (p+3, q+2), (p+2, q+2) and (p+3, q+1).

On the surface of the array-form optical elements K facing the image pickup face Ni, the optical components M1 are each a microlens located at a position corresponding to four pixels in the corresponding first pixel group Pg1. On the first pixel group Pg1, light from the corresponding optical component M1 in the array-form optical element K is incident. The optical component M1 causes a most part of the light which has passed the area D1 to be incident on the pixels P1A and P3A in the image pickup element N, and causes a most part of the light which has passed the area D2 to be incident on the pixels P2B and P4B in the image pickup element N.

On the surface of the array-form optical element K facing the image pickup face Ni, the optical components M2 are each a microlens located at a position corresponding to four pixels in the corresponding second pixel group Pg2. On the second pixel group Pg2, light from the corresponding optical component M2 in the array-form optical element K is incident. The optical component M2 causes a most part of the light which has passed the area D1 to be incident on the pixels P2A and P4A in the image pickup element N, and causes a most part of the light which has passed the area D2 to be incident on the pixels P1B and P3B in the image pickup element N.

The pixels P1A, P2A, P1B and P2B each include a filter having a first spectral transmittance characteristic. The filter having the first spectral transmittance characteristic mainly passes light rays in a green range and absorbs light rays of the other ranges. The pixels P3A and P3B each include a filter having a second spectral transmittance characteristic. The filter having the second spectral transmittance characteristic mainly passes light rays in a red range and absorbs light rays of the other ranges. The pixels P4A and P4B each include a filter having a third spectral transmittance characteristic. The filter having the third spectral transmittance characteristic mainly passes light rays in a blue range and absorbs light rays of the other ranges.

The pixels P1A and P3A, the pixels P1B and P3B, the pixels P2A and P4A, and the pixels P2B and P4B are located alternately in the x direction (first direction). The pixels P1A and P4A, the pixels P1B and P4B, the pixels P2A and P3A, and the pixels P2B and P3B are located alternately in the y direction (second direction). The pixels P1A, P3A, P1B and P3B are arrayed in the same row (arrayed in the x direction), and the pixels P2A, P4A, P2B and P4B are arrayed in the same row (arrayed in the y direction). The rows of P1A, P3A, P1B and P3B and the rows of the P2A, P4A, P2B and P4B are located alternately in the y direction. As can be seen, the plurality of pixels are located in a Bayer array. In the case where the pixels are located in the Bayer array, the pixels P1A and P2B, which include a filter for transmitting light of the green range, are located obliquely in the pixel group Pg1. The pixels P1B and P2A, which include a filter for transmitting light of the green range, are located obliquely in the pixel group Pg2.

The array-form optical element K has a function of distributing the outgoing direction of light rays in accordance with the angle of incidence of the light rays. Therefore, the array-form optical element K can cause light to be incident on the pixels on the image pickup face Ni so as to correspond to the areas D1 and D2. The structure of causing the light to be incident on the pixels in this manner is realized by appropriately setting parameters such as the refractive index of the array-form optical element K, the distance from the image pickup face Ni, the radius of curvature of the surface of the optical elements M1 and the like.

In this embodiment, a member including the array-form optical element and the image pickup element N will be referred to as an "image pickup member".

Now, a specific structure of the array-form optical element will be described.

Figure 4:
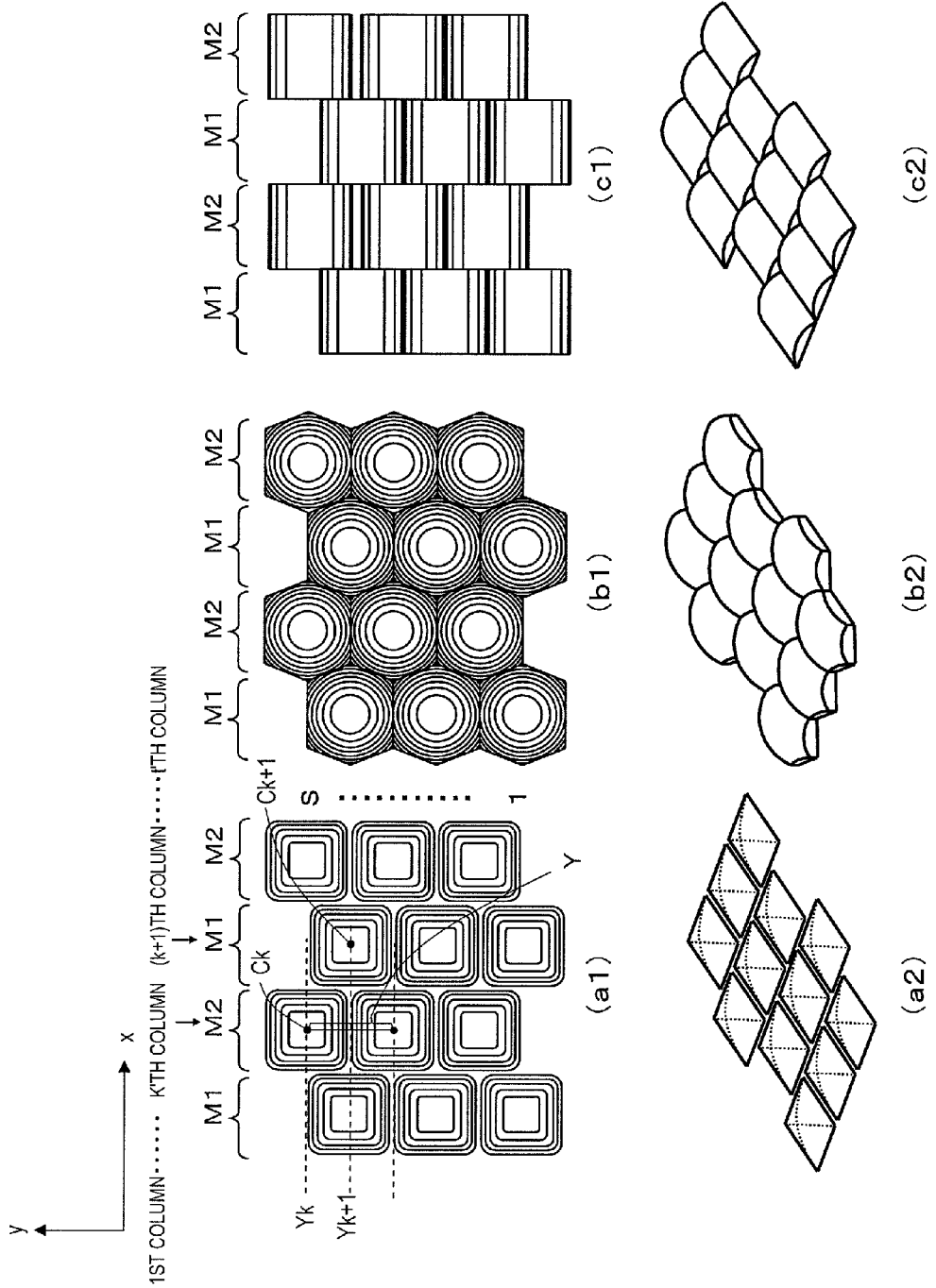
FIG. 4(a1) shows an arrangement of a microlens array having a rotationally asymmetric shape with respect to an optical axis, and contours thereof.

FIGS. 4(a1), (a2), (b1), (b2), (c1) and (c2) each show a shape of the optical components M1 and M2 shown in FIGS. 3(a) and (b). FIG. 4(a1) shows an arrangement of optical components (microlenses) each having a rotationally asymmetric shape with respect to the optical axis, and contours thereof. FIG. 4(a2) is an isometric view thereof. Such a microlens array can be produced by forming quadrangular prisms on a glass plate and performing heat treatment thereon.

As shown in FIG. 4(a1), s number of the optical components M1 arrayed in the y direction form a column, and s number of optical components M2 arrayed in the y direction form a column (s is an integer of 2 or greater). The columns are on a surface of the array-form optical element K (e.g., surface perpendicular to the optical axis of the lens optical system L). The columns of the optical components M1 and the columns of the optical components M2 are located alternately in the x direction. For example, these columns are first through t'th columns (n is an integer of 2 or greater) arrayed in the x direction. Where an optional integer which is equal to or greater than 1 and smaller than t is k ($1 \leq k < n$), a position Yk of center Ck, in the y direction, of an optical component located in the k'th column is shifted in the y direction with respect to a position Yk+1 of center Ck+1, in the y direction, of a corresponding optical component located in the (k+1)th column. Namely, the positions of the centers of the optical components M1 and the optical components M2 are shifted with respect to each other in the y direction.

Now, on the surface of the array-form optical element K, a distance between the centers of two optical components M1 or M2 adjacent to each other in the y direction is defined as Y. The pitch of the optical components M1 in the y direction is Y, and the pitch of the optical components M2 in the y direction is also Y. In this case, the shifting amount between the position Yk and the position Yk+1 in the y direction is, for example, 0.5Y (half pitch). In consideration of production errors of the array-form optical element K and the like, the shifting amount may be 0.45Y or greater and 0.55Y or less. When the shifting amount is 0.45Y or greater and 0.55Y or less, the light incident on the areas D1 and D2 can be distributed to desired pixels by the array-form optical element K.

The "center, in the y direction, of the optical component" is, for example, the apex of a three-dimensional object forming each optical component, or the center of a line segment connecting two ends, in the y direction, of each optical component.

FIG. 4(A) shows an arrangement and contours of microlenses each having a rotationally symmetric shape with respect to the optical axis. FIG. 4(b2) is an isometric view thereof. The microlenses shown in FIG. 4(b1) have a hexagonal shape. However, each microlens is formed to cover four pixels located in a square array and is not typically hexagonal. In FIGS. 4(b1) and (b2), the borders of the microlenses are hexagonal. Alternatively, a part of each microlens above the border may be spherical or aspherical. Microlenses of such a rotationally symmetric shape can be formed on a glass plate or the like by heating imprint or UV imprint.

FIG. 4(c1) shows an arrangement and contours of a microlens array having a structure in which cylindrical microlenses are shifted alternately by two pixels, namely, at half pitch. FIG. 4(c2) is an isometric view thereof. The microlens array shown in FIG. 4(c1) can also be formed on a glass plate or the like by heating imprint or UV imprint.

FIG. 5(a) shows results of three-dimensional light ray tracing simulation when the microlenses shown in FIGS. 4(a1) and (a2) are applied to the array-form optical element in this embodiment. In FIG. 5(a), only light beams passing the area D1, among the light passing the array-form optical element K, are shown. In the case of the microlenses having such a rotationally asymmetric shape, the radius of curvature in the longitudinal and lateral directions (directions parallel to four sides of a bottom surface of each microlens) is different from the radius of curvature in oblique directions (directions of diagonal lines of the microlenses). Thus, light leaks to an adjacent pixel to cause crosstalk.

FIG. 5(b) shows results of three-dimensional light ray tracing simulation when the microlenses shown in FIGS. 4(b1) and (b2) are applied to the array-form optical element in this embodiment. In FIG. 5(b), only a luminous flux passing one area, among the light passing the array-form optical element K, is shown. It can be seen that the crosstalk as in FIG. 5(a) is not caused. By using the optical components each having a rotationally symmetric shape in the array-form optical element, the crosstalk between a first color image and a second color image can be reduced.

The microlenses shown in FIGS. 4(b1) and (b2) are hexagonal, but the microlenses do not need to be hexagonal as long as being rotationally symmetric.

FIG. 5(c) shows results of three-dimensional light ray tracing simulation when the cylindrical microlenses shown in FIGS. 4(c1) and (c2) are applied to the array-form optical element in this embodiment. In FIG. 5(c), only a luminous flux passing one area, among the light passing the array-form optical element K, is shown. It can be seen that the crosstalk as in FIG. 5(a) is not caused. By using the optical components each having a cylindrical shape in the array-form optical element, the crosstalk between the first color image and the second color image can be reduced.

Now, a method for generating a color image will be described.

FIGS. 6(a) and (b) show only the pixels on which the light that has passed the areas D1 and D2 is incident, respectively. As shown in FIG. 4, the optical components M2 are shifted with respect to the optical components M1 by half pitch in the y direction. Therefore, the pixels on which the light that has passed the area D1 is incident, and the pixels on which the light that has passed the area D2 is incident, both include color information on red (P3A or P3B), green (P1A and P2A or P1B and P2B) and blue (P4A or P4B).

As shown in FIG. 2, the centers of gravity of the areas D1 and D2 are away from each other by the distance B. Therefore, when the light which has passed the area D1 and the light which has passed the area D2 form images, parallax corresponding to the distance to the subject is caused on the image pickup face Ni. As described above, the pixels on which the light that has passed the areas D1 and D2 is incident include color information on red, green and blue. Therefore, a first color image and a second color image having parallax with respect to each other can be formed by use of the pixels on which the light that has passed the area D1 is incident and the pixels on which the light that has passed the area D2 is incident.

The first color image and the second color image having parallax with respect to each other are generated by the first signal processing section C1 (shown in FIG. 1). The first color image and the second color image are respectively generated by the color information, specifically, luminance information, obtained from the pixels shown in FIGS. 6(a) and (b). As shown in FIGS. 6(a) and (b), in the first and second pixel groups corresponding to the color images, one pixel includes the color information on only one color. Therefore, the color information on the other colors is supplemented from luminance values of nearby pixels for generating a color image.

For example, the first color image is generated as follows. As shown in FIG. 6(a), information on only green (G2) is provided at the position of the pixel P2A of the second pixel group Pg2. Therefore, information on red (R) and blue (B) is supplemented from nearby pixels, so that the information on blue, green and red is provided at the position of the P2A of the second pixel group Pg2. Specifically, the luminance information on the pixel P2A of the second pixel group Pg2 is supplemented with the luminance information on red and blue provided by the pixel P3A and the pixel P4A close to the pixel P2A in the y direction, the x direction or an oblique direction. Such luminance information is used as the luminance information on red and blue of the pixel P2A. Similarly, the luminance information on the pixel P4A of the second pixel group Pg2 is supplemented with the luminance information on green and red provided by the pixel P2A and the pixel P3A close to the pixel P4A in the y direction, the x direction or an oblique direction. Such luminous information is used as the luminance information on green and red of the pixel P4A. The luminance information on red and blue of the pixel P1A of the first pixel group Pg1 and the luminance information on green and blue of the pixel P3A of the first pixel group Pg1 are obtained by supplement in a similar manner. Owing to this, the first color image can be provided.

Referring to FIG. 6(b), the second color image is generated in a similar manner. The luminance information on red and green of the pixel P4B of the first pixel group Pg1, the luminance information on red and blue of the pixel P2B of the first pixel group Pg1, the luminance information on red and blue of the pixel P1B of the second pixel group Pg2, and the luminance information on green and blue of the pixel P3B of the second pixel group Pg2 are also obtained by supplement. Owing to this, the second color image can be provided.

In each of the first and second color images, the color information in the y direction is partially missing. For example, in the first color image, the pixels P4B and P2B are missing among the four pixels of the pixel group Pg1. The luminance information on such a missing pixel may be supplemented, after the above-described color supplement, by use of the luminance value of the color detected from a pixel adjacent to the missing pixel in the y direction and the luminance value of the color obtained by supplement for the adjacent pixel. Specifically, the luminance information on red, blue and green of the pixel P4B and the pixel P2B of the first pixel group Pg1 may be obtained from the luminance information on red, blue and green of the pixel P3A and the pixel P1A adjacent to the pixels P2B and P4B in the y direction.

By the above-described supplement process, the first color image and the second color image can bed generated.

In this embodiment, the first color image and the second color image can be acquired at every column of pixels extending in the y direction. Therefore, the pitch of the pixels forming the first color image and the second color image is not made long, and thus an image for stereoscopic viewing which has a high resolution can be provided.

In this embodiment, an image pickup element of the conventional Bayer array type is usable. Therefore, it is not necessary to make an initial investment for photomasks or the like for color filters of a specific filter arrangement, and thus the value of the initial investment can be made small.

The optical system in the image pickup device in this embodiment may be an image-side telecentric optical system. Owing to this, even if the angle of view is changed, the principal light rays are incident on the array-form optical element K at an angle close to 0°. Therefore, the crosstalk among the luminous fluxes reaching the pixels P1A, P1B, P2A, P2B, P3A, P3B, P4A and P4B can be reduced over the entirety of the image pickup area.

Figure 7:
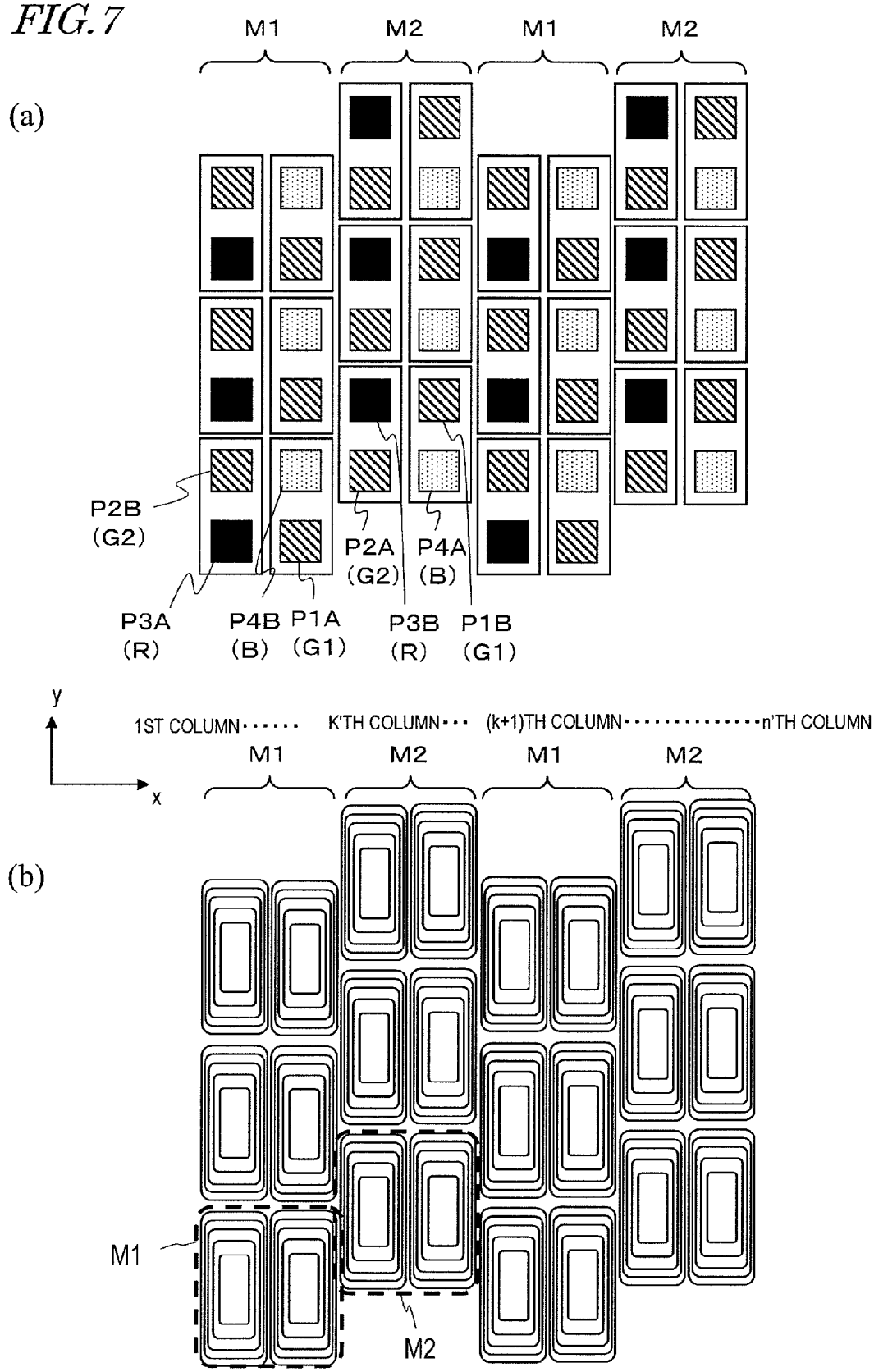
FIGS. 7(a) and (b) show another relationship between the array-form optical element K and the image pickup element N in Embodiment 1.

In this embodiment, one optical component (M1 or M2) of the array-form optical element corresponds to one microlens. Alternatively, as shown in FIGS. 7(a) and (b), one optical component (M1 or M2) may have two microlenses. In this case, one microlens is provided to correspond to two pixels.

As described above, in this embodiment, the first color image and the second color image can be acquired by use of a single image pickup system (e.g., by one cycle of image pickup). The first color image and the second color image can be handled as an image as seen from a right eye and an image as seen form a left eye. Therefore, when the first color image and the second color image are displayed on a three-dimensional monitor, the subject can be viewed stereoscopically.

An image for stereoscopically viewing the subject is acquired by use of a single image pickup system. Therefore, unlike in the case of an image pickup device using a plurality of image pickup optical systems, it is not necessary to match the characteristics and positions of a plurality of image pickup optical systems.

Embodiment 2

In Embodiment 2, unlike in Embodiment 1, the array-form optical element is formed on the image pickup face.

Herein, elements in Embodiment 2 that are substantially the same to those in Embodiment 1 will not be described in detail.

FIG. 8(a) shows an image pickup element N in this embodiment. On an image pickup face Ni of an image pickup section Np, the array-form optical element K is provided. In this embodiment, a microlens array Md is formed on the image pickup face Ni of the image pickup element N. On the image pickup face Ni, pixels are arrayed in rows and columns like in Embodiment 1. One microlens corresponds to a plurality of pixels. In this embodiment, like in Embodiment 1, light which has passed different areas of the stop s can be guided to different pixels. FIG. 8(b) shows a modification of this embodiment. In the structure shown in FIG. 8(b), a microlens Ms is formed on the image pickup face Ni so as to cover the pixels P, and the array-form optical element K is stacked on a surface of the microlens Ms with a low refractive index layer W being held therebetween. The structure shown in FIG. 8(b) can provide a higher light collection efficiency than the structure shown in FIG. 8(a).

In this embodiment, the optical components M1 and M2 in the array-form optical element K and the pixels in the image pickup element N are arrayed in substantially the same manner as in Embodiment 1. Namely, the optical components M1 are each provided at a position corresponding to four pixels of the first pixel Pg1, and the optical components M2 are each provided at a position corresponding to four pixels of the second pixel Pg2.

Now, it is assumed that the pixel P3A belonging to the first pixel group Pg1 is located at a position (p, q). p and q are respectively integers fulfilling $1 \leq p < L$ and $1 \leq q < m$. In this case, the remaining pixels P1A, P2B and P4B of the first pixel group Pg1 are respectively located at positions (p+1, q), (p, q+1) and (p+1, q+1). The pixels P2A, P1B, P3B and P4A of the second pixel group Pg2 are respectively located at positions (p+2, q+1), (p+3, q+2), (p+2, q+2) and (p+3, q+1).

Embodiment 3

In Embodiment 3, unlike in Embodiments 1 and 2, the areas D1 and D2 are away from each other by a prescribed distance. Herein, elements in Embodiment 3 that are substantially the same to those in Embodiment 1 will not be described in detail.

FIG. 9(a) is a front view of a stop s' as seen from the side of the subject. The areas D1 and D2 formed by the stop s' are both circular and are distanced from each other. V1' and V2' are respectively centers of gravity of the area D1 and the area D2. Distance B' between the point V1' and the point V2' corresponds to a base length in the case where both eyes are used for viewing. In this embodiment, the base length B' can be made longer than the base length B shown in FIG. 2 in Embodiment 1, so that the subject can be seen stereoscopically on a three-dimensional monitor with a higher sense of depth. In the case where the areas D1 and D2 are not distanced from each other as in Embodiment 1, the light passing the vicinity of the border between the areas D1 and D2 causes crosstalk. By locating the areas D1 and D2 as being distanced from each other as in this embodiment, the crosstalk can be reduced.

Figure 9:
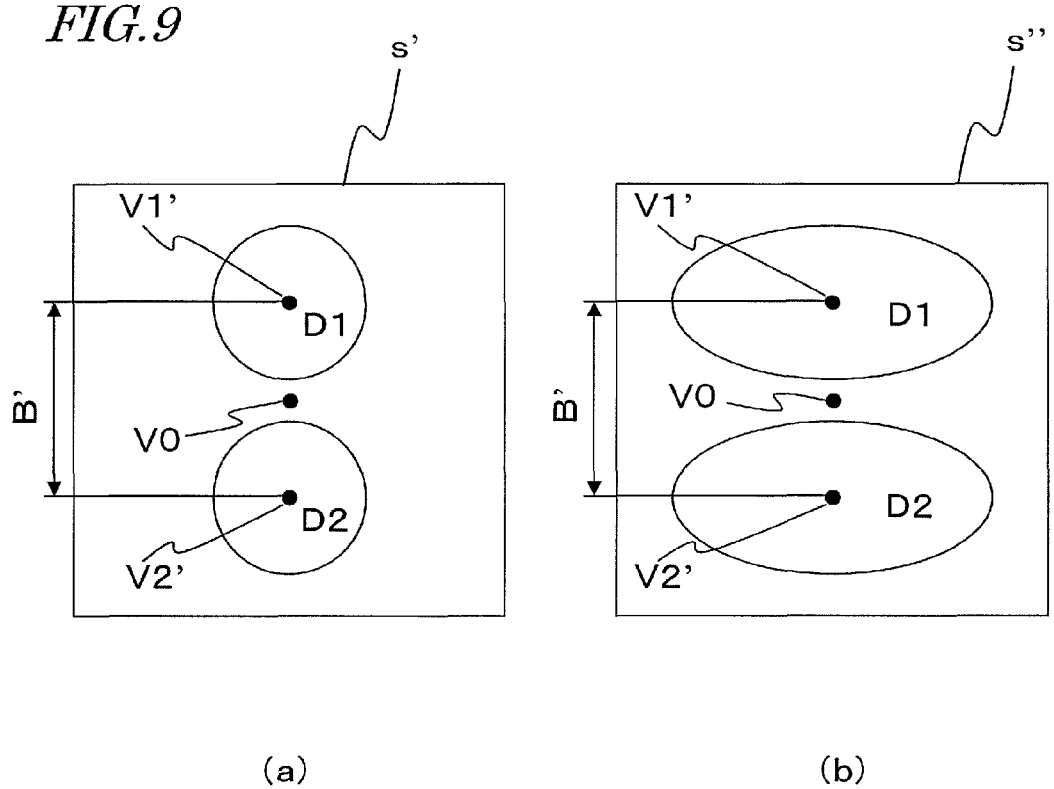
FIGS. 9(a) and (b) are each a front view of areas D1 and D2 in Embodiment 3 as seen from the side of the subject.

The openings of the areas D1 and D2 may be elliptical as in a stop s" shown in FIG. 9(*b*). Such elliptical openings can increase the amount of light passing the areas, and thus can improve the sensitivity of an image than the openings shown in FIG. 9(*a*).

Embodiment 4

In Embodiment 4, unlike in Embodiment 3, the positions of the areas D1 and D2 separated from each other can be changed by a stop. Herein, elements in Embodiment 4 that are substantially the same to those in Embodiment 3 will not be described in detail.

Figure 10:
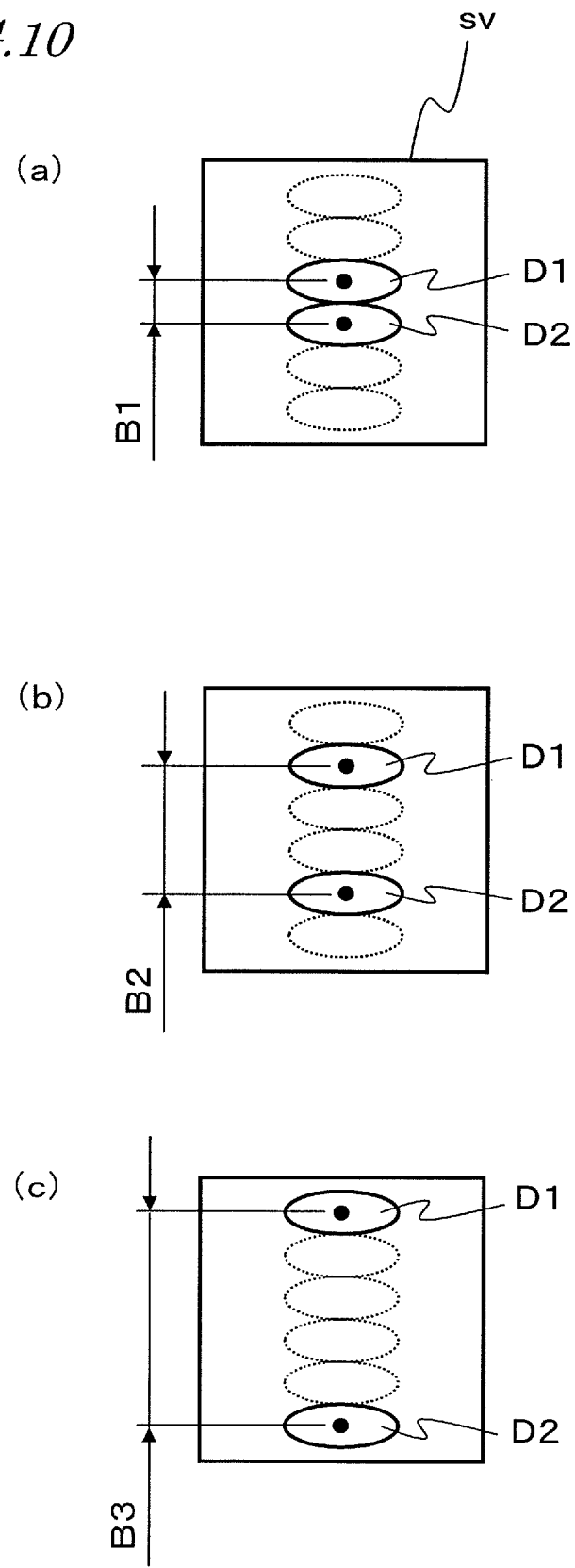
FIGS. 10(a) through (c) are each a front view of areas D1 and D2 in Embodiment 4 as seen from the side of the subject.

In Embodiment 4, as shown in FIGS. 10(*a*) through (*c*), a stop sv is formed of a liquid crystal shutter array, and the positions of the areas D1 and D2 can be changed by switching the positions of openings of the liquid crystal shutter array. The liquid crystal shutter array is formed of a transmissive liquid crystal display element or the like using a common TN (Twisted Nematic) liquid crystal material.

Figure 11:
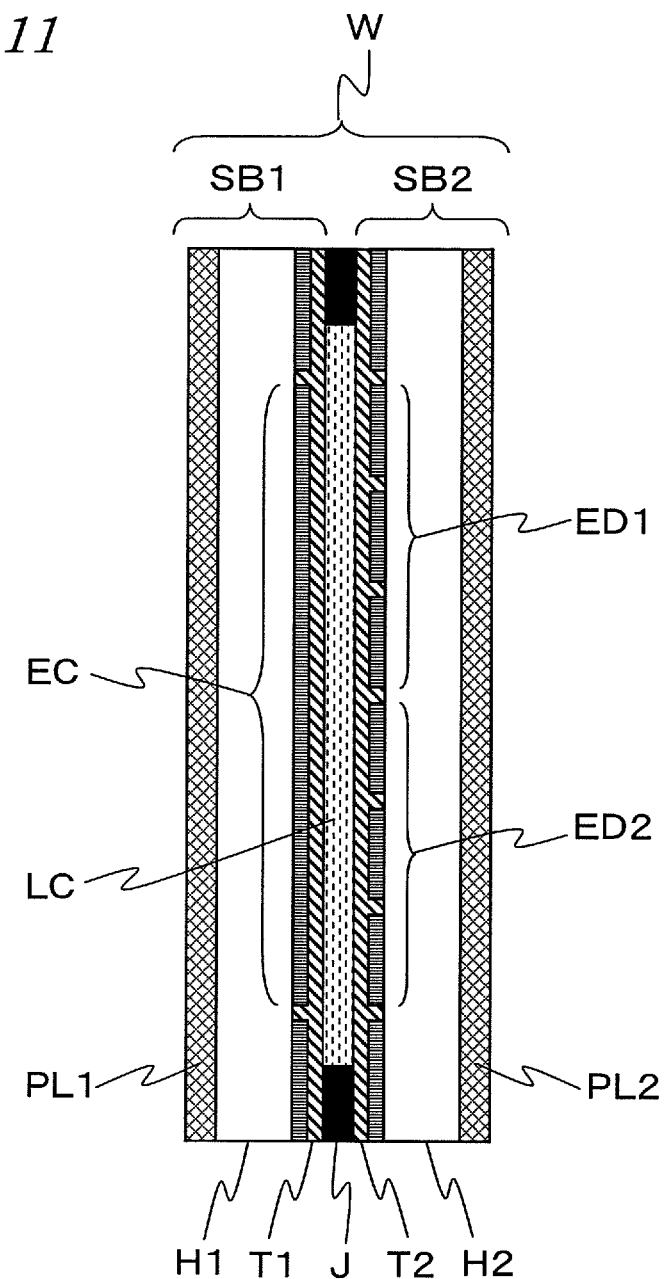
FIG. 11 is a cross-sectional view of a liquid crystal shutter array in Embodiment 4.

FIG. 11 is a cross-sectional view of the liquid crystal shutter array W. The liquid crystal shutter array W includes a substrate SB1 and a substrate SB2 which are bonded together by a sealing material. A liquid crystal layer LC is in a space between the substrate SB1 and the substrate SB2. The substrate SB1 includes a polarization plate PL1, a glass plate H1, a common electrode EC and an alignment film T1. The substrate SB2 includes a polarization plate PL2, a glass plate H2, electrode groups ED1 and ED2 provided in selected areas, and an alignment film T2. The liquid crystal shutter array is of a normally black type and is structured to transmit light when a driving voltage is ON and to block the light when the driving voltage is OFF.

In FIGS. 10(*a*), (*b*) and (*c*), B1, B2 and B3 each represent a base length. The positions of the openings can be changed by turning individual liquid crystal shutters on or off. Since the positions of the openings can be changed, the subject can be displayed so as to provide an appropriate sense of depth in accordance with the distance to the subject.

In this embodiment, the base line can be changed in three steps as shown in FIGS. 10(*a*) through (*c*). Alternatively, the base line may be changed in two steps or four or more steps. Each of the liquid crystal shutters may be circular or rectangular.

Embodiment 5

In Embodiment 5, the positions the areas D1 and D2 separated from each other can be changed with a higher resolution by a stop.

Figure 12:
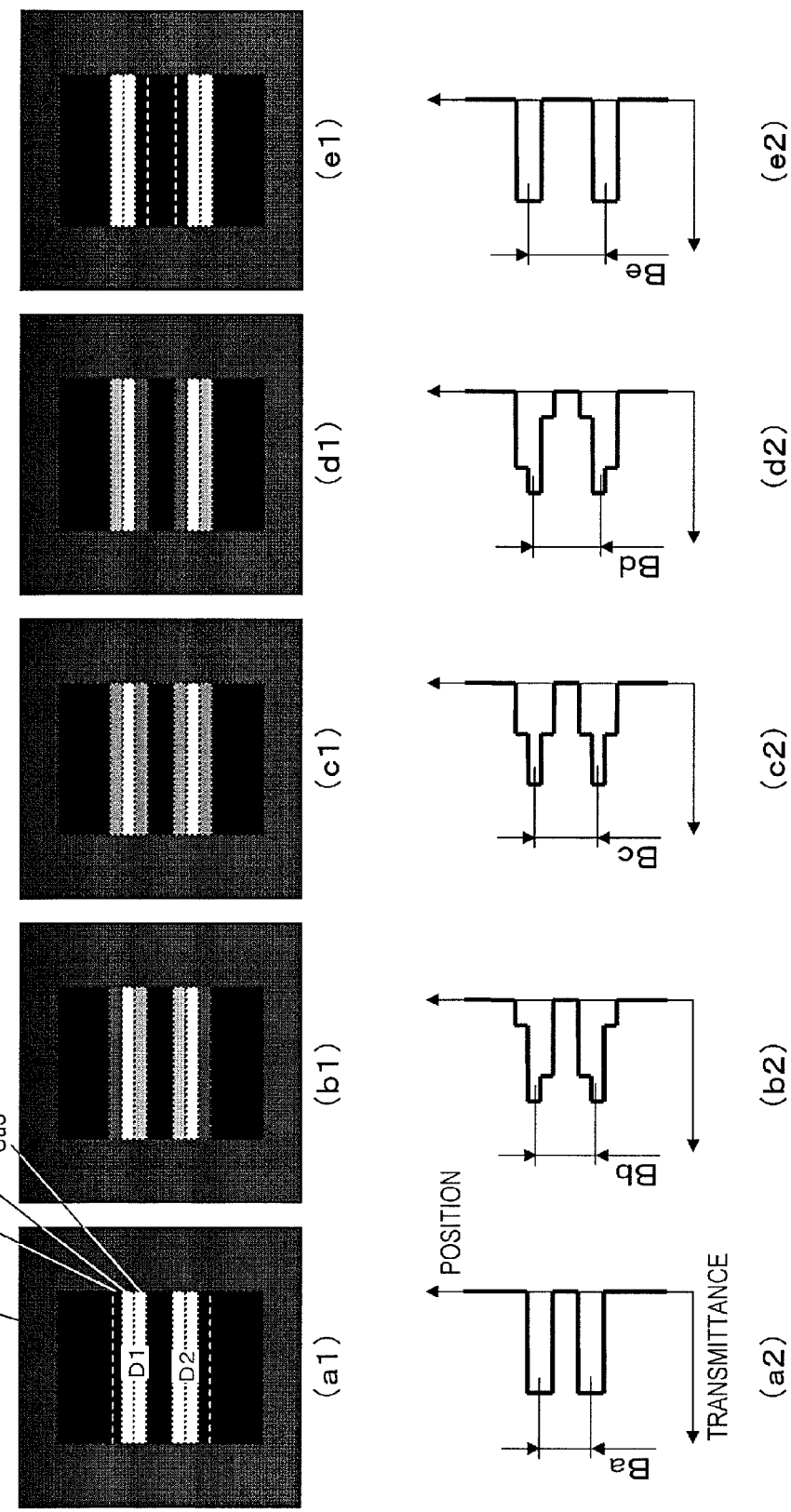
FIGS. 12(a1) through (e1) are each a front view of areas D1 and D2 in Embodiment 5 as seen from the side of the subject.

In Embodiment 5, as shown in FIGS. 12(*a*1) through (*e*1), a stop sv' is formed of a liquid crystal shutter array. In the liquid crystal shutter array, the areas D1 and D2 are openings. The areas D1 and D2 each have a plurality of sub areas. For the sake of explanation, FIGS. 12(*a*1) through (*e*1) each show three sub areas Su1, Su2 and Su3 among the sub areas included in each of the areas D1 and D2. However, the areas D1 and D2 may each have sub areas other than the three sub areas Su1, Su2 and Su3.

The transmittance of the liquid crystal shutter is controlled by the sub areas Su1, Su2 and Su3 shown in each of FIGS. 12(*a*1) through (*e*1). Owing to this, the center of gravity of the transmittance distribution of the area D1 and the center of gravity of the transmittance distribution of the area D2 can be changed.

FIGS. 12(*a*2) through (*e*2) are graphs showing the transmittance of the liquid crystal shutters shown in FIGS. 12(*a*1) through (*e*1), respectively.

In FIGS. 12(*a*2) through (*e*2), the centers of gravity of the transmittance distributions of the areas D1 and D2 respectively correspond to the centers of gravity of the openings of the areas D1 and D2. Distances Ba through Be each represent a base length, which is the distance between the centers of gravity of the openings of the areas D1 and D2.

In order to improve the resolution of the base length by use of the ON/OFF liquid crystal shutters operable at two gray scales as described in Embodiment 4, the number of liquid crystal shutters needs to be increased. However, when the number of liquid crystal shutters is increased, the numerical aperture of the liquid crystal shutters is decreased. Therefore, the transmittance of the areas D1 and D2 is decreased. This results in an inconvenience such that, for example, the sensitivity of an image is also decreased.

By using the liquid crystal shutters operable at a plurality of gray scales as in this embodiment, the resolution of the base length can be increased with a small number of liquid crystal shutters. In addition, since the decrease in the numerical aperture of the liquid crystal shutters can be suppressed, the decrease in the transmittance of the areas D1 and D2 can also be suppressed. Owing to this, the decrease in the sensitivity of an image can also be suppressed.

Embodiment 6

In Embodiment 6, unlike in Embodiments 1 through 5, a lens optical system L includes a 1A reflecting member (reflection face) and a 1B reflecting member (reflection face) for causing light to be incident on the area D1, and a 2A reflecting member (reflection face) and a 2B reflecting member (reflection face) for causing light to be incident on the area D2. Herein, elements in Embodiment 6 that are substantially the same to those in Embodiment 1 will not be described in detail.

FIG. 13(*a*) is a schematic view of the lens optical system L of an image pickup device A in Embodiment 6. Referring to FIG. 13(*a*), a luminous flux B1 passes a reflecting face J1a, a reflecting face J1b, the open area D1 of the stop s, the objective lens L1, and the array-form optical element K in this order, and then reaches the image pickup face Ni of the image pickup element N. A luminous flux B2 passes a reflecting face J2a, a reflecting face J2b, the open area D2 of the stop s, the objective lens L1, and the array-form optical element K in this order, and then reaches the image pickup face Ni of the image pickup element N. Optical axes V1" and V2" in the case where both eyes are used for viewing are respectively determined by the light beams passing the centers of gravity of the open areas D1 and D2 of the stop s. Distance B" between the optical axes V1" and V2" corresponds to a base length in the case where both eyes are used for viewing.

In this embodiment, a color image for stereoscopic viewing which has a high resolution can be acquired by use of a single image pickup system. In addition, since the light paths to the areas D1 and D2 are bent by the reflecting faces, the base length can be extended. Therefore, the subject can be seen stereoscopically on a three-dimensional monitor with a higher sense of depth.

In FIG. 13(a), the reflecting faces are provided by mirrors. Alternatively, the reflecting faces may be provided by prisms.

Still alternatively, as shown in FIG. 13(b), concave lenses La and Lb may be located before the reflecting faces J1a and J2a. By providing the concave lenses, the angle of view can be increased while the base length is kept the same, or the base length can be set to be shorter while the angle of view is kept the same.

In this specification, the "single image pickup system" refers to an image pickup system including a lens optical system (excluding the array-form optical element which is included in the image pickup member) which forms an image on a single primary image forming face. The "primary image forming face" refers to a face on which light incident on the lens optical system form an image for the first time. These definitions are applicable to the embodiments other than this embodiment. In this embodiment, the structures shown in FIGS. 13(a) and 13(b) both have a primary image forming face on the image pickup face Ni or in the vicinity thereof.

Embodiment 7

In Embodiment 7, unlike in Embodiments 1 through 6, the lens optical system includes an objective lens and a relay optical system. Herein, elements in Embodiment 7 that are substantially the same to those in Embodiment 1 will not be described in detail.

Figure 14:
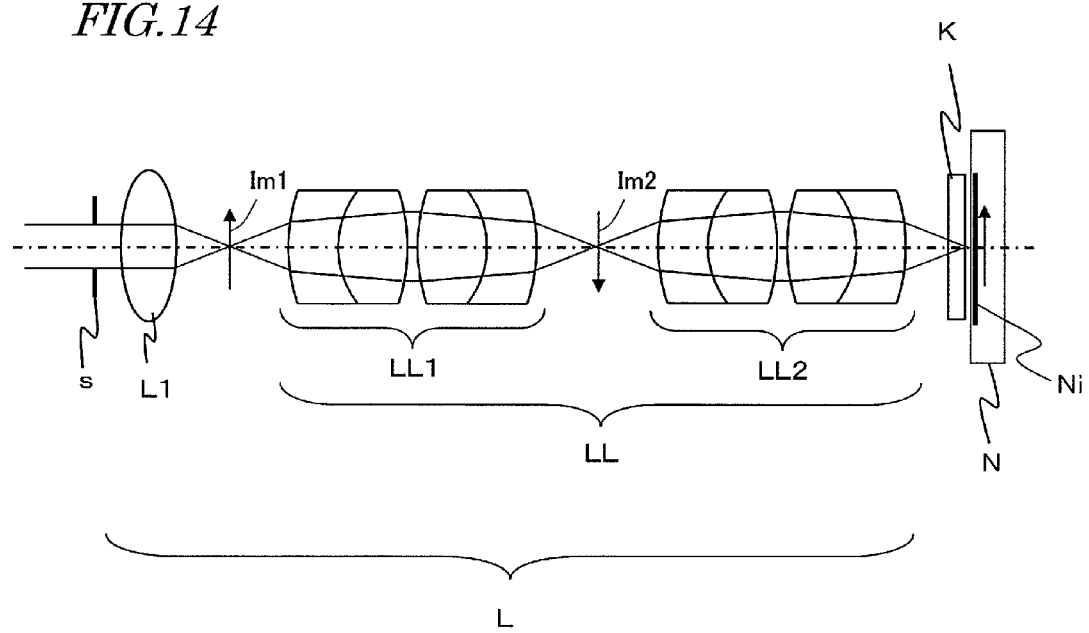
FIG. 14 is a schematic view of an optical system in Embodiment 7.

FIG. 14 is a schematic view of an optical system of an image pickup device A in Embodiment 6. As shown in FIG. 14, an optical system L in this embodiment includes the stop s, the objective lens L1 and a relay optical system LL. The relay optical system LL includes a first relay lens LL1 and a second relay lens LL2. The relay optical system LL having such a structure can form intermediate images Im1 and Im2 sequentially in accordance with the number of relay lenses. By providing such a relay optical system LL between the objective lens L and the array-form optical element K, the optical length can be extended while the focal length is kept the same. Therefore, when such an optical system is used in, for example, a hard endoscope in which the optical length is extended by a relay optical system, stereoscopic viewing can be provided by a single image pickup system.

In the case where a pair of optical systems are used to provide stereoscopic viewing as by a conventional technique, the optical characteristics of the pair of objective lenses need to be matched to each other and the optical characteristics of the pair of relay optical systems LL also need to be matched to each other. Since such optical systems require a great number of lenses, it is very difficult to match the characteristics of the optical systems. In this embodiment, a single optical system is used as described above. Therefore, it is not necessary to match the characteristics of the optical systems, which can simplify the assembly process.

In FIG. 14, the relay optical system includes two relay lenses. Alternatively, the relay optical system may include any other number of relay lenses. Still alternatively, a field lens may be provided at a position on the optical path where an intermediate image is to be formed.

In this embodiment also, a color image for stereoscopic viewing which has a high resolution can be acquired by use of a single image pickup system. In this embodiment, the first relay lens LL1 forms the intermediate image Im2 from the intermediate image Im1 formed by the objective lens L1. The second relay lens LL2 forms an image on the image pickup face Ni from the intermediate image Im2. The objective lens L1 forms the intermediate image Im1 on the primary image forming face. In this embodiment, an image is formed on a single primary image forming face by a single lens optical system.

Embodiment 8

In Embodiment 8, unlike in Embodiments 1 through 7, a signal processing section for measuring a distance to a target is provided.

Figure 15:
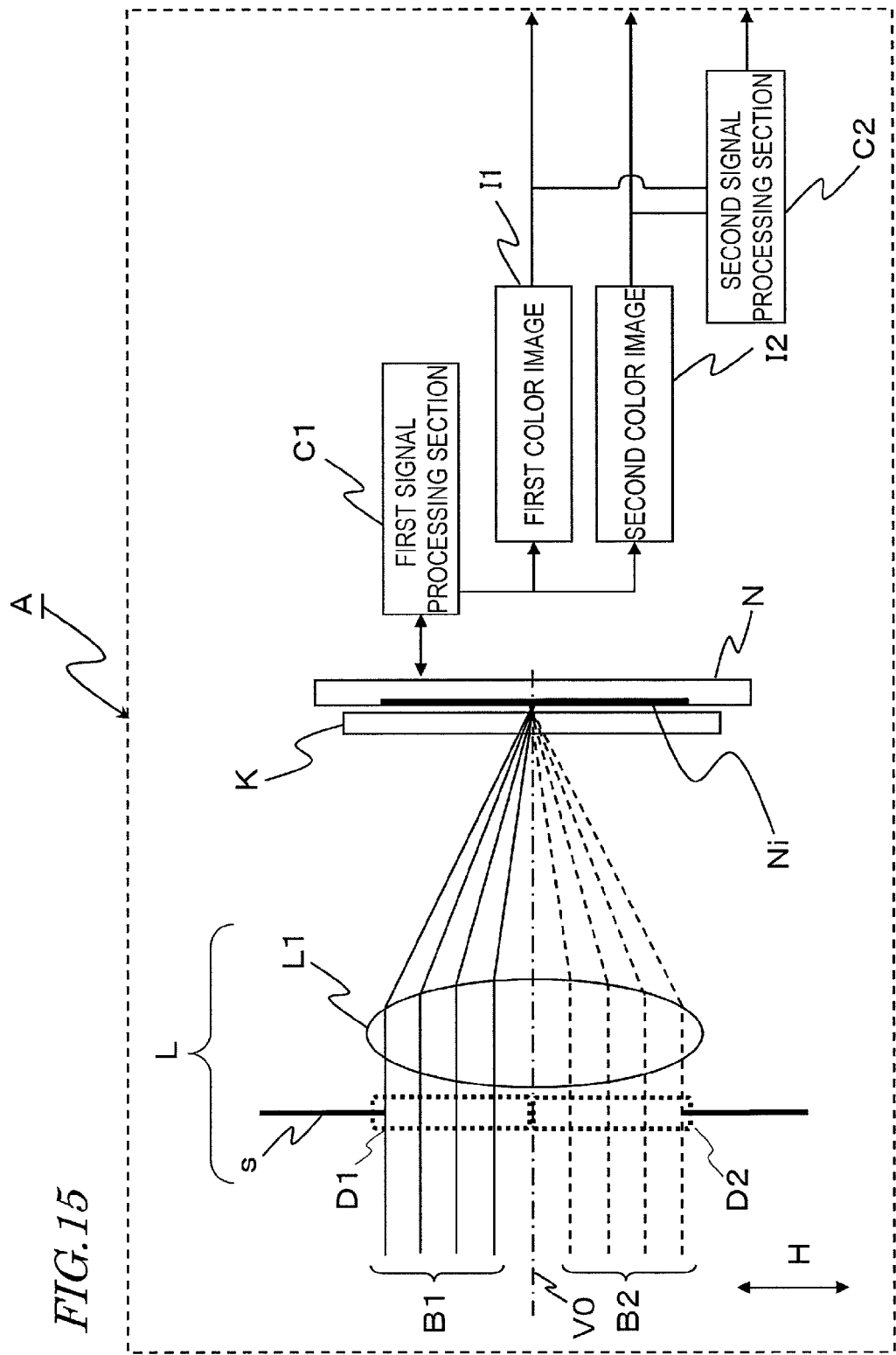
FIG. 15 is a schematic view of an image pickup device Embodiment 8.

FIG. 15 is a schematic view of an optical system of an image pickup device A in Embodiment 8. The structure in this embodiment includes a second signal processing section C2 for measuring a distance to a target in addition to the elements shown in FIG. 1. The other elements are substantially the same as those in Embodiment 1 and will not be described in detail.

The second signal processing section C2 extracts, by pattern matching, parallax caused between a prescribed image block in the first color image (base image) and a prescribed image block in the second color image (reference image), and calculates the distance to a subject based on the extracted parallax amount. The degree of correlation of pattern matching can be found by, for example, an evaluation factor SAD (Sum of Absolute Difference), which is a total sum of differences (absolute values) of luminance values of pixels between the base image and the reference image. Now, where a calculation block size of a small area is m×n pixels, the SAD can be found by expression 1.

$$SAD = \sum_{i=0}^{m-1}\sum_{j=0}^{n-1} I0(x+i, y+j) - I1(x+dx+i, y+j) \quad \text{[Expression 1]}$$

In expression 1, x and y are coordinates of the image pickup face, and I0 and I1 are respectively a luminance value of the base image and a luminance value of the reference image at the coordinates shown in the parentheses.

Figure 16:
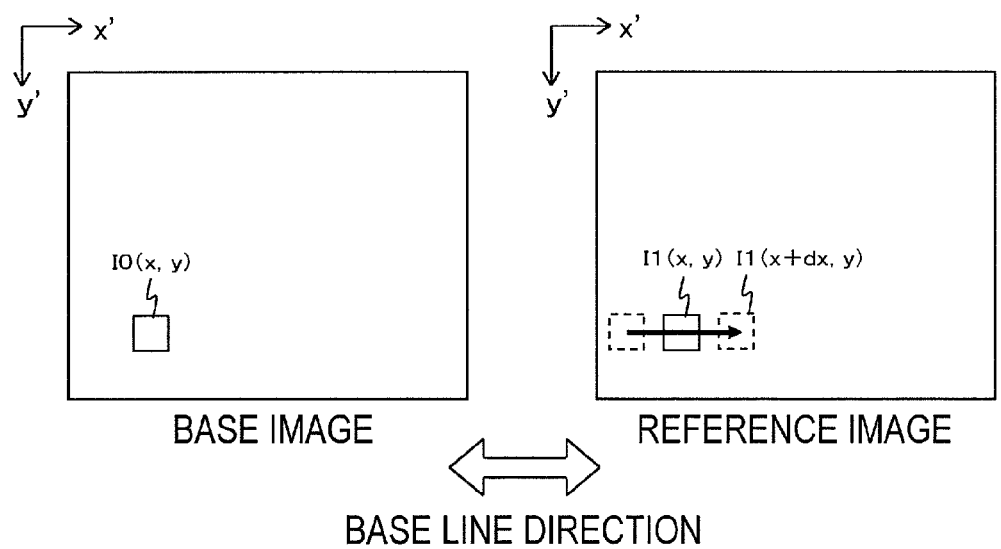
FIG. 16 is a view provided for explaining a SAD calculation in Embodiment 8.

FIG. 16 is a view provided for explaining a SAD calculation. As shown in FIG. 16, the SAD is calculated while the position of a search block area of the reference image is shifted by dx in the direction of the base line with respect to a base block area of the base image. The value of dx at which the SAD has the minimum value is the parallax amount δ in expression 1. Since the SAD can be calculated for any coordinates, distance information on the entire area of the image pickup field of view can be acquired.

According to the SAD calculation, the parallax amounts for all color signals of the first color image and the second color image may be extracted and averaged. Alternatively, the parallax amount of only one color signal may be extracted. The parallax amount may be extracted with the color signal being converted into a monochrome signal.

Hereinafter, a method for finding a distance to the subject based on the extracted parallax amount will be described.

FIGS. 17(a) and 17(b) are conceptual views provided for explaining a distance measuring principle in this embodiment. Herein, for the purpose of explaining the distance measuring principle simply, an ideal optical system using a thin lens will be used. FIG. 17(a) is a front view of the areas D1 and D2 of the stop s as seen from the side of the subject. The reference signs in FIG. 17(a) represent the same elements as those in FIG. 2.

For a simpler explanation of the principle, it is assumed that the openings of the areas D1 and D2 in the stop s are each a circle having a diameter which is half of diameter D of the objective lens L1. The base length B is half of the diameter of the objective lens L1. The areas D1 and D2 are existent also in a plane including a principal point of the objective lens L1, and the area other than the areas D1 and D2 is blocked against light. For a simpler explanation, the array-form optical element is not shown.

FIG. 17(b) shows an optical path of the optical system. In FIG. 17(b), point o is the object point; point p is the principal point of the objective lens L1; and face Ni is the image pickup face. Distance a is a distance in the direction of the optical axis from the object point o to the principal point p of the objective lens L1 (distance to the subject); distance b is a distance in the direction of the optical axis from the principal point p of the objective lens L1 to the image forming position; distance f is the focal length; and distance e is a distance from the principal point p to the image pickup face Ni. Here, expression 2 is derived from a formula regarding lenses.

$$\frac{1}{a} + \frac{1}{b} = \frac{1}{f} \qquad \text{[Expression 2]}$$

In FIG. 17(b), distance δ represents the parallax on the image pickup face between light beams which have passed the areas D1 and D2 of the objective lens L1. Here, expression 3 is derived from a geometric relationship between the optical paths.

$$\frac{B}{b} = \frac{\delta}{b-e} \qquad \text{[Expression 3]}$$

From expressions 2 and 3, the distance a to the subject can be found by expression 4.

$$a = \frac{1}{\frac{1}{e}\left(\frac{\delta}{B} - 1\right) + \frac{1}{f}} \qquad \text{[Expression 4]}$$

In expression 4, the focal length f and base length B are known, and parallax δ is extracted by the pattern matching described above. The distance e from the principal point p to the image pickup face Ni varies in accordance with the setting of the focus distance. The distance e is made a constant by fixing the focus distance. Therefore, the distance a to the subject can be calculated.

When the distance e=focal length f and the focus distance is set to be infinite in expression 4, expression 4 is represented as expression 5.

$$a = \frac{fB}{\delta} \qquad \text{[Expression 5]}$$

Expression 5 is the same as the expression of triangulation performed by a pair of image pickup optical system located in parallel to each other.

By the above-described calculations, the distance to the subject picked up at an optional position on the image or the information on the distance to the subject can be acquired for the entire image by a single image pickup optical system.

Other Embodiments

In Embodiments 1 through 8, the lens optical system L includes one objective lens L1. Alternatively, the lens optical system L may include a plurality of groups of lenses or a plurality of lenses.

Figure 18:
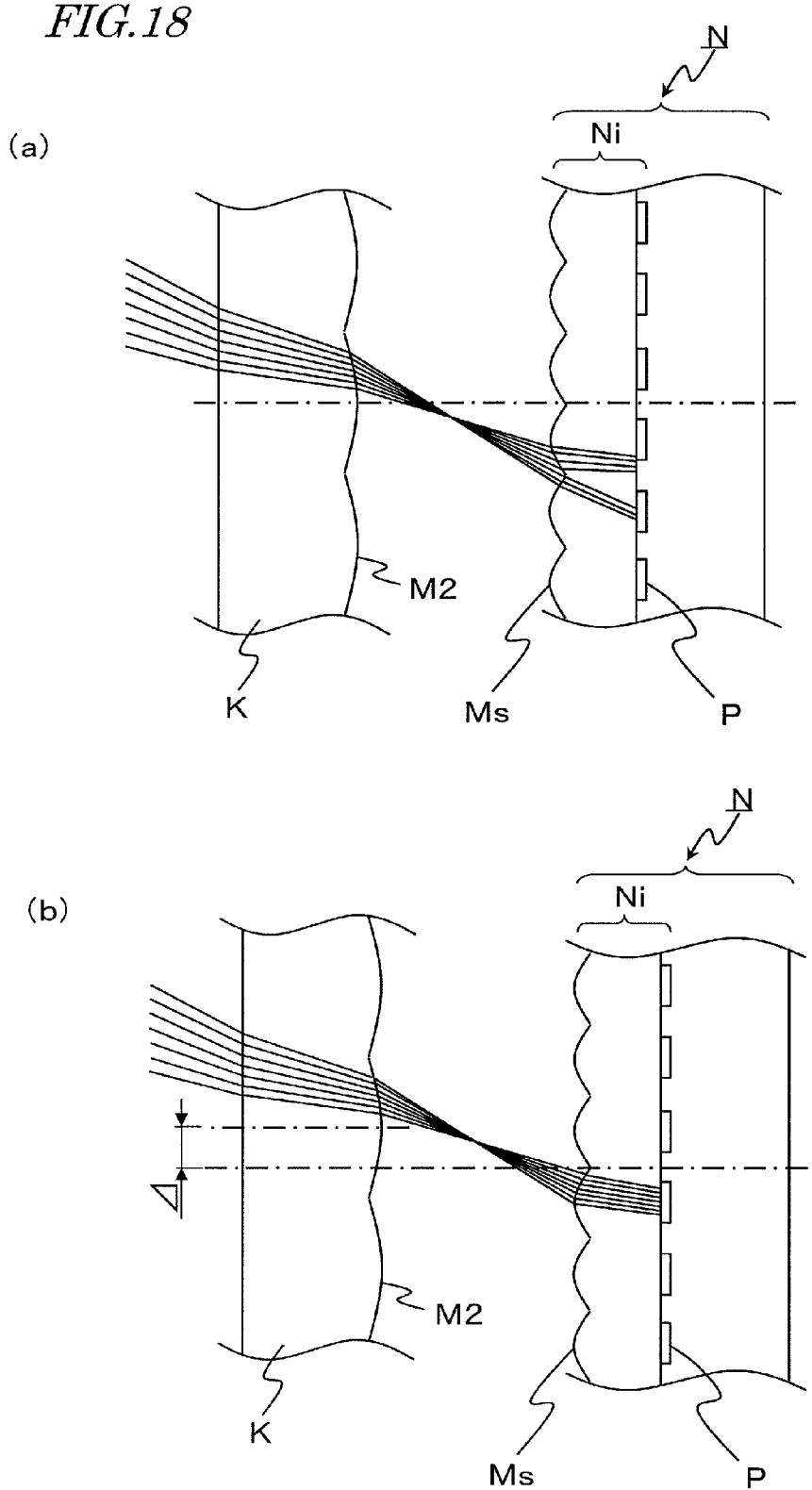
FIG. 18(a) is an enlarged view of an image pickup face and the vicinity thereof when crosstalk is caused in an embodiment.
FIG. 18(b) is an enlarged view of the image pickup face and the vicinity thereof when the crosstalk is alleviated.

In Embodiments 1 through 8, the lens optical system L is an image-side telecentric optical system. Alternatively, lens optical system L may be an image-side non-telecentric optical system. FIG. 18(a) is an enlarged view of an image pickup section and the vicinity thereof in the case where the lens optical system L is an image-side non-telecentric optical system. In FIG. 18(a), only the luminous flux passing the area D1, among the light passing the array-form optical element K, is shown. As shown in FIG. 18(a), in the case where the lens local system L is an image-side non-telecentric optical system, crosstalk easily occurs due to leak of light to an adjacent pixel. By offsetting the array-form optical element by Δ with respect to the pixel array as shown in FIG. 18(b), the crosstalk can be reduced. The angle of incidence of the luminous flux varies in accordance with the image height. Therefore, the offset amount Δ may be set in accordance with the angle of incidence of the luminous flux on the image pickup face. The image-side non-telecentric optical system can shorten the optical length as compared with an image-side telecentric optical system, and thus can reduce the size of the image pickup device A.

In Embodiments 1 through 8, the pixels of the image pickup element are in the Bayer array. Alternatively, the pixels may be arrayed as shown in FIG. 19(a) or 19(b). In FIG. 19(a), pixels in a pixel group Pg3 are arrayed in the same manner as the pixels in the first pixel group Pg1 shown in FIG. 3(b). In each of the pixel group Pg3 and a pixel group Pg4, the green pixels P1A and P2B are located in an oblique direction, and the green pixels P1B and P2A are located in an oblique direction. The red pixel P3A and the blue pixel Pg4B of the pixel group Pg3 are arrayed in the opposite manner to the red pixel P4A and the blue pixel P3B of the pixel group Pg4. In FIG. 19(b), in each of pixel groups Pg5 and Pg6, the green pixels P1A and P2B are located in the column direction, and the green pixels P1B and P2A are located in the column direction. In such arrays of the pixels also, like in FIGS. 6(a) and (b), the pixels on which the light that has passed the area D1 is incident, and the pixels on which the light that has passed the area D2 is incident, both include color information on red (P3A or P3B), green (P1A and P2A or P1B and P2B) and blue (P4A or P3B).

The image pickup device in Embodiments 1 through 7 includes the first signal processing section C1, whereas the image pickup device in Embodiment 8 further includes the second signal processing section C2. The image pickup device does not need to include such a signal processing section. When the image pickup device does not include signal processing section, a PC or the like external to the image pickup device may be used to perform the processes which would be performed by the first signal processing section C1 and the second signal processing section C2. Namely, the present invention can be realized also by a system including an image pickup device which includes the lens optical system L, the array-form optical element K and the image pickup device N, and also including an external signal processing device.

INDUSTRIAL APPLICABILITY

The image pickup device disclosed in the present application is useful as an image pickup device of a digital still camera, a digital video camera or the like. The image pickup device disclosed in the present application is also applicable to a distance measuring device for monitoring the environment or the crew of an automobile, and for stereoscopic viewing and three-dimensional information input in a game device, a PC, a mobile terminal, an endoscope or the like.

REFERENCE SIGNS LIST

A Image pickup device
L Lens optical system
L1 Lens
D1, D2 Area
s, sv, sv' Stop
K Array-form optical element
N Image pickup element
N1 Image pickup face
Ms Microlens on the image pickup element
M1, M2, Md Optical component on the array-form optical element
P1A(B)-P4A(B) Light receiving element on the image pickup element
C1 First signal processing section
C2 Second signal processing section
LL Relay optical system
LL1 First relay lens
LL2 Second relay lens

The invention claimed is:

1. An image pickup device, comprising:
a lens optical system including a first area and a second area located at a position different from that of the first area;
an image pickup element including a plurality of pixels and an image pickup face, the plurality of pixels including a plurality of first pixels and a plurality of second pixels on which light that has passed the lens optical system is incident and which include a filter having a first spectral transmittance characteristic, a plurality of third pixels on which light that has passed the lens optical system is incident and which include a filter having a second spectral transmittance characteristic, and a plurality of fourth pixels on which light that has passed the lens optical system is incident and which include a filter having a third spectral transmittance characteristic; and
an array-form optical element located between the lens optical system and the image pickup element, the array-form optical element including a plurality of optical components;
wherein:
the plurality of pixels have one row of first through l'th pixels (l is an integer of 2 or greater) arrayed in a first direction, and m number of such rows (m is an integer of 2 or greater) are arrayed in a second direction as first through m'th rows; and thus the plurality of pixels are arrayed on the image pickup face;
a position of center, in the first direction, of each of the l number of pixels located in a j'th row among the m number of rows ($1 \leq j < m$) is substantially the same as a position of center, in the first direction, of a corresponding one of the l number of pixels located in a (j+1)th row;
the plurality of optical components are arrayed on a surface of the array-form optical element such that first through s'th optical components (s is an integer of 2 or greater) are arrayed in one column in the second direction, and t number of such columns (t is an integer of 2 or greater) are arrayed in the first direction as first through t'th columns; and a position of center, in the second direction, of each of the optical components located in a k'th column among the t number of columns ($1 \leq k < t$) is shifted in the second direction with respect to a position of center, in the second direction, of a corresponding one of the optical components located in a (k+1)th column;
the plurality of first, second, third and fourth pixels are arrayed on the image pickup face in m rows by l columns (l and m are each an integer of 2 or greater);
in the case where one of the plurality of optical components is located at a position corresponding to four pixels located at positions (p, q), (p, q+1), (p+1, q) and (p+1, q+1) on the image pickup face ($1 \leq p < l$, $1 \leq q < m$), another one of the plurality of optical components is located at a position corresponding to four pixels located at positions (p+2, q+1), (p+2, q+2), (p+3, q+1) and (p+3, q+2) on the image pickup face;
the plurality of first pixels include a 1A pixel and a 1B pixel, the plurality of second pixels include a 2A pixel and a 2B pixel, the plurality of third pixels include a 3A pixel and a 3B pixel, and the plurality of fourth pixels include a 4A pixel and a 4B pixel;
the pixel located at position (p,q) is one of the 3A pixels, the pixel located at position (p, q+1) is one of the 2B pixels, the pixel located at position (p+1, q) is one of the 1A pixels, and the pixel located at position (p+1, q+1) is one of the 4B pixels;
the pixel located at position (p+2, q+1) is one of the 2A pixels, the pixel located at position (p+2, q+2) is one of the 3B pixels, the pixel located at position (p+3, q+1) is one of the 4A pixels, and the pixel located at position (p+3, q+2) is one of the 1B pixels;
the optical components in the k'th row cause light which has passed the first area to be incident on the 1A pixel and the 3A pixel, and cause light which has passed the second area to be incident on the 2B pixel and the 4B pixel; and
the optical components in the (k+1)th row cause the light which has passed the first area to be incident on the 2A pixel and the 4A pixel, and cause the light which has passed the second area to be incident on the 1B pixel and the 3B pixel.

2. The image pickup device of claim 1, wherein where a distance between centers, in the second direction, of two optical components adjacent to each other in the second direction, among the plurality of optical components, is Y on the surface of the array-form optical element, the position of the center, in the second direction, of each of the optical components located in the k'th column is shifted by 0.45Y or greater and 0.55Y or less in the second direction with respect to the position of the center, in the second direction, of a corresponding one of the optical components located in the (k+1)th column.

3. The image pickup device of claim 1, further comprising a first signal processing section for generating a first color image by use of luminance information on the 1A, 2A, 3A and 4A pixels and generating a second color image by use of luminance information on the 1B, 2B, 3B and 4B pixels.

4. The image pickup device of claim 1, wherein the plurality of optical components are each formed of one or two microlenses.

5. The image pickup device of claim 1, wherein the first, second, third and fourth pixels are located in a Bayer array.

6. The image pickup device of claim 1, wherein the array-form optical element is formed on the image pickup element.

7. The image pickup device of claim 6, further comprising a microlens provided between the array-form optical element and the image pickup element;
   wherein the array-form optical element is formed on the image pickup element with the microlens being held therebetween.

8. The image pickup device of claim 1, wherein the lens optical system further includes a liquid crystal shutter array for changing the positions of the first area and the second area.

9. The image pickup device of claim 1, wherein the lens optical system further includes a liquid crystal shutter array in which a transmittance through an opening thereof is changeable.

10. The image pickup device claim 1, wherein the lens optical system further includes a relay optical system.

11. A distance measuring device, comprising:
   the image pickup device of claim 3; and
   a second signal processing section for calculating a distance to a subject by use of the first color image and the second color image.

12. An image pickup system, comprising:
   the image pickup device of claim 1; and
   a signal processing device for generating a first color image by use of luminance information on the 1A, 2A, 3A and 4A pixels and generating a second color image by use of luminance information on the 1B, 2B, 3B and 4B pixels.

13. An array-form optical element causing light to be incident on a plurality of pixels, the array-form optical element comprising a plurality of optical components on a surface thereof, wherein:
   the plurality of optical components are arrayed on the surface such that t number of columns, each including s number of optical components arrayed in a second direction, are arrayed in a first direction (s and t are each an integer of 2 or greater);
   and a position of center, in the second direction, of each of the optical components located in a k'th column among the t number of columns ($1 \leq k < t$) is shifted in the second direction with respect to a position of center, in the second direction, of a corresponding one of the optical components located in a (k+1)th column;
   in the case where one of the plurality of optical components is located at a position corresponding to four pixels of the plurality of pixels located at positions (p, q), (p, q+1), (p+1, q) and (p+1, q+1) ($1 \leq p < l$, $1 \leq q < m$), another one of the plurality of optical components is located at a position corresponding to four pixels of the plurality of pixels located at positions (p+2, q+1), (p+2, q+2), (p+3, q+1) and (p+3, q+2);
   the optical components in the k'th row cause light which has passed the first area to be incident on the pixel located at position (p+1, a) and the pixel located at position (p,q), and cause light which has passed the second area to be incident on the pixel located at position (p, q+1) and the pixel located at position (p+1, q+1); and
   the optical components in the (k+1)th row cause the light which has passed the first area to be incident on the pixel located at position (p+2, q+1) and the pixel located at position (p+3, q+1), and cause the light which has passed the second area to be incident on the pixel located at position (p+3, q+2) and the pixel located at position (p+2, q+2).

14. The array-form optical element of claim 13, wherein the plurality of optical components are each formed of one or two microlenses.

* * * * *